(12) United States Patent
Wilcox

(10) Patent No.: US 11,894,322 B2
(45) Date of Patent: Feb. 6, 2024

(54) LAUNCH STRUCTURES FOR RADIO FREQUENCY INTEGRATED DEVICE PACKAGES

(71) Applicant: ANALOG DEVICES, INC., Norwood, MA (US)

(72) Inventor: Bruce E. Wilcox, Cary, NC (US)

(73) Assignee: Analog Devices, Inc., Norwood, MA (US)

( * ) Notice: Subject to any disclaimer, the term of this patent is extended or adjusted under 35 U.S.C. 154(b) by 43 days.

(21) Appl. No.: 16/421,221

(22) Filed: May 23, 2019

(65) Prior Publication Data

US 2019/0371747 A1    Dec. 5, 2019

Related U.S. Application Data

(60) Provisional application No. 62/677,549, filed on May 29, 2018.

(51) Int. Cl.
| | | |
|---|---|---|
| *H01L 23/66* | (2006.01) | |
| *H01L 23/498* | (2006.01) | |
| *H01L 23/00* | (2006.01) | |

(52) U.S. Cl.
CPC ........ *H01L 23/66* (2013.01); *H01L 23/49816* (2013.01); *H01L 23/49822* (2013.01); *H01L 23/49838* (2013.01); *H01L 24/05* (2013.01); *H01L 24/16* (2013.01); *H01L 2223/6616* (2013.01); *H01L 2223/6655* (2013.01); *H01L 2224/0401* (2013.01); *H01L 2224/0557* (2013.01); *H01L 2224/16227* (2013.01); *H01L 2924/1421* (2013.01); *H01L 2924/2027* (2013.01); *H01L 2924/30111* (2013.01)

(58) Field of Classification Search
CPC ....... H01L 2223/6655; H01L 23/49822; H01L 2924/30111; H01L 23/66; H05K 2201/09263
See application file for complete search history.

(56) References Cited

U.S. PATENT DOCUMENTS

| | | |
|---|---|---|
| 4,841,101 A | 6/1989 | Pollock |
| 5,223,672 A | 6/1993 | Pinneo et al. |
| 5,432,482 A | 7/1995 | Bailey |
| 5,523,622 A | 6/1996 | Harada et al. |
| 5,760,650 A | 6/1998 | Faulkner et al. |

(Continued)

FOREIGN PATENT DOCUMENTS

DE    20 2014 104 574 U    11/2014

OTHER PUBLICATIONS

Stratix 10 Devices, High Speed Signal Interface Layout Design Guideline, Intel, pp. 1-88, Nov. 11, 2016.

(Continued)

*Primary Examiner* — Daniel Luke
(74) *Attorney, Agent, or Firm* — Knobbe, Martens Olson & Bear LLP

(57) ABSTRACT

Radio frequency integrated device packages having bump and/or ball launch structures are disclosed herein. The bump launch structures can comprise patterned metallic and insulating material that substantially matches the impedance of a radio frequency integrated device die. The ball launch structures can comprise patterned metallic and insulating material that substantially matches the impedance of a system board.

22 Claims, 15 Drawing Sheets

(56) References Cited

U.S. PATENT DOCUMENTS

| | | | |
|---|---|---|---|
| 5,783,870 A | 7/1998 | Mostafazadeh et al. | |
| 5,819,401 A | 10/1998 | Johannes et al. | |
| 5,994,975 A | 11/1999 | Allen et al. | |
| 6,008,530 A | 12/1999 | Kano | |
| 6,111,198 A | 8/2000 | Tower | |
| 6,423,575 B1 | 7/2002 | Tran et al. | |
| 6,455,880 B1 | 9/2002 | Ono et al. | |
| 6,514,783 B1 | 2/2003 | Welstand | |
| 6,680,544 B2 | 1/2004 | Lu et al. | |
| 6,841,731 B1 | 1/2005 | Zanello | |
| 6,844,502 B2 | 1/2005 | Deng et al. | |
| 6,900,533 B2 | 5/2005 | Burton | |
| 7,045,386 B2 | 5/2006 | Hikita et al. | |
| 7,412,172 B2 | 8/2008 | Kuchta et al. | |
| 7,444,734 B2 | 11/2008 | Gaucher et al. | |
| 7,528,475 B2 | 5/2009 | Go et al. | |
| 7,569,918 B2 | 8/2009 | Gerber et al. | |
| 7,642,635 B2 | 1/2010 | Kikuchi et al. | |
| 7,732,913 B2 | 9/2010 | Hsieh et al. | |
| 7,968,978 B2 | 6/2011 | Adlerstein et al. | |
| 7,994,622 B2 | 8/2011 | Mohammed et al. | |
| 8,119,931 B1 | 2/2012 | Liu | |
| 8,153,449 B2 | 4/2012 | Adlerstein et al. | |
| 8,618,629 B2 | 12/2013 | Kim et al. | |
| 8,623,700 B1 | 1/2014 | Bernstein et al. | |
| 8,773,204 B2 | 7/2014 | Cabanillas et al. | |
| 9,048,232 B2 * | 6/2015 | Colussi | H01L 23/66 |
| 9,059,490 B2 | 6/2015 | DeVries et al. | |
| 9,184,117 B2 | 11/2015 | Ho et al. | |
| 9,245,835 B1 | 1/2016 | Jiang et al. | |
| 9,318,450 B1 | 4/2016 | Reza et al. | |
| 9,437,558 B2 | 9/2016 | Pye et al. | |
| 9,577,416 B2 | 2/2017 | Nisslbeck et al. | |
| 9,666,544 B2 | 5/2017 | Zu et al. | |
| 9,711,465 B2 * | 7/2017 | Liao | H01L 23/528 |
| 9,812,379 B1 | 11/2017 | Chiu et al. | |
| 9,978,698 B1 | 5/2018 | Trulli et al. | |
| 10,325,742 B2 | 6/2019 | Koul et al. | |
| 10,872,816 B2 | 12/2020 | Hollis | |
| 10,945,337 B2 | 3/2021 | Ikeda et al. | |
| 11,350,537 B2 | 5/2022 | Winter et al. | |
| 11,417,615 B2 | 8/2022 | Lin | |
| 11,424,196 B2 | 8/2022 | Mahon et al. | |
| 2003/0080822 A1 | 5/2003 | Tzsuang et al. | |
| 2004/0173370 A1 | 9/2004 | Deng et al. | |
| 2004/0227583 A1 | 11/2004 | Shaffner et al. | |
| 2008/0023814 A1 | 1/2008 | Yang | |
| 2008/0100394 A1 | 5/2008 | Margomenos et al. | |
| 2009/0057872 A1 | 3/2009 | Ehlers et al. | |
| 2009/0102740 A1 | 4/2009 | Rofougaran | |
| 2010/0200968 A1 | 8/2010 | Purden et al. | |
| 2010/0232480 A1 | 9/2010 | Bhandal et al. | |
| 2010/0321129 A1 | 12/2010 | Onody et al. | |
| 2011/0084358 A1 | 4/2011 | Kim et al. | |
| 2011/0223692 A1 | 9/2011 | Adlerstein et al. | |
| 2012/0062332 A1 | 3/2012 | Nagai et al. | |
| 2012/0193771 A1 | 8/2012 | Masuda | |
| 2013/0015467 A1 | 1/2013 | Krumbein et al. | |
| 2013/0256849 A1 | 10/2013 | Danny et al. | |
| 2013/0256850 A1 | 10/2013 | Danny et al. | |
| 2014/0118084 A1 | 5/2014 | Takemura | |
| 2014/0300003 A1 | 10/2014 | Kariyazaki et al. | |
| 2015/0042417 A1 | 2/2015 | Onodera et al. | |
| 2015/0097633 A1 | 4/2015 | DeVries et al. | |
| 2016/0064792 A1 | 3/2016 | Qiang et al. | |
| 2016/0126920 A1 | 5/2016 | Kaper | |
| 2016/0181211 A1 | 6/2016 | Kamgaing et al. | |
| 2016/0343653 A1 | 11/2016 | Huang et al. | |
| 2016/0344084 A1 | 11/2016 | Ghassemi et al. | |
| 2017/0048969 A1 | 2/2017 | Qiang et al. | |
| 2017/0077896 A1 | 3/2017 | Sugaya et al. | |
| 2017/0111078 A1 | 4/2017 | Onodera et al. | |
| 2017/0179050 A1 | 6/2017 | Kariyazaki | |
| 2017/0268827 A1 | 9/2017 | Kaminski et al. | |
| 2018/0012834 A1 | 1/2018 | Wang et al. | |
| 2018/0034421 A1 | 2/2018 | Abdo et al. | |
| 2018/0122747 A1 | 5/2018 | Sun et al. | |
| 2018/0358675 A1 | 12/2018 | Laighton et al. | |
| 2019/0267361 A1 | 8/2019 | Rahim et al. | |
| 2019/0295966 A1 * | 9/2019 | Kong | H01L 21/4853 |
| 2019/0371746 A1 | 12/2019 | Mahon et al. | |
| 2020/0168567 A1 | 5/2020 | Lin | |
| 2020/0375049 A1 | 11/2020 | Winter et al. | |

OTHER PUBLICATIONS

Alleaume, PF et al., "Millimetre-wave hot-via interconnect-based GaAs chip-set for automotive Radar and security sensors," Proceedings of the 3rd European Microwave Integrated Circuits Conference, Oct. 2008, Amsterdam, The Netherlands, pp. 52-55.

Bessemoulin, A. et al., "A chip-scale packaged amplifier MMIC using broadband hot-via-transitions," 11th GAAS Symposium, Munich 2003, pp. 415-418.

Bessemoulin, A., "Design data for hot-via interconnects in chip scale packaged MMICs up to 110 GHz," 12th GAAS Symposium, Amsterdam 2004, pp. 495-498.

Bessemoulin, A. et al., "Hot-via interconnects: A step toward surface mount chip scale packaged MMICs up to 110 GHz," IEEE CSIC Digest, 2004, pp. 237-240.

Bessemoulin, A. et al., "Soldered hot-via E-band and W-band power amplifier MMICs for millimeter-wave chip scale packaging," IEEE, 2016, pp. 1-4.

Kazior, T.E. et al., "DBIT—Direct Backside Interconnect Technology: A manufacturable, bond wire free interconnect technology for microwave and millimeter wave MMICs," IEEE MTT-S Digest, 1997, pp. 723-726.

Lin, H.T. et al., "6 inch 0.1 um GaAs pHEMT technology for E/V/band application," CS Mantech Conference, May 16-19, 2011, Palm Springs, CA, pp. 1-3.

Lin. S. et al., "Development of an ultra-wideband suspended stripline to shielded microstrip transition,." IEEE Microwave and Wireless Components Letters, Sep. 2011, vol. 21, No. 9. pp. 474-476.

Schmückle, F.J. et al., "40 GHz hot-via flip-chip interconnects," IEEE MTT-S Digest, 2003, pp. 1167-1170.

Zhou, J. et al., "3D heterogeneous integration technology using hot via MMIC and silicon interposer with millimeter wave application," IEEE, 2017, pp. 499-502.

U.S. Appl. No. 16/282,148, filed Feb. 21, 2019, Mahon et al.

U.S. Appl. No. 16/282,170, filed Feb. 21, 2019, Lin.

Extended European Search Report issued in application No. 19176598.1 dated Oct. 4, 2019.

\* cited by examiner

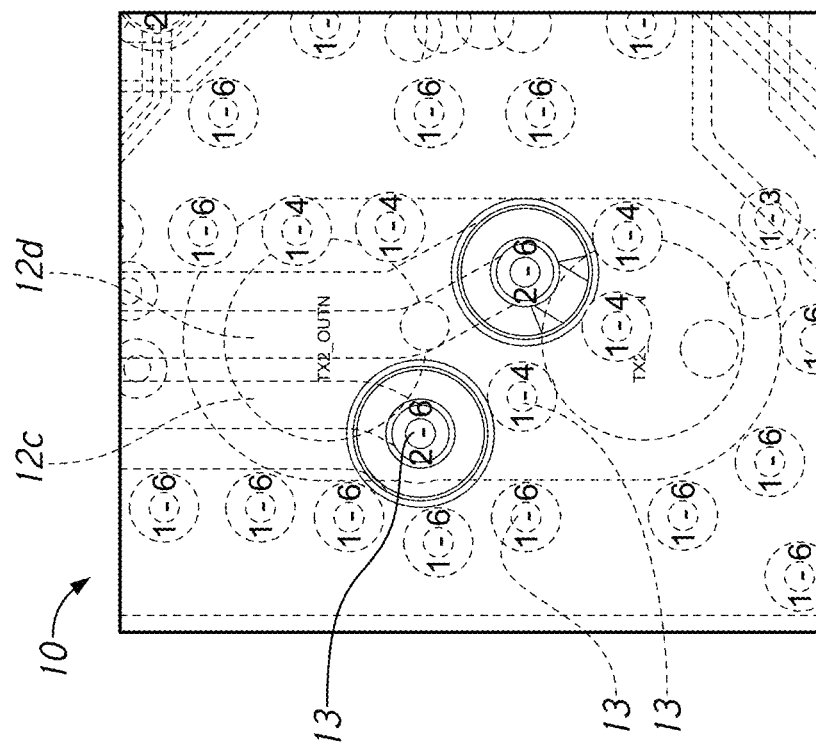
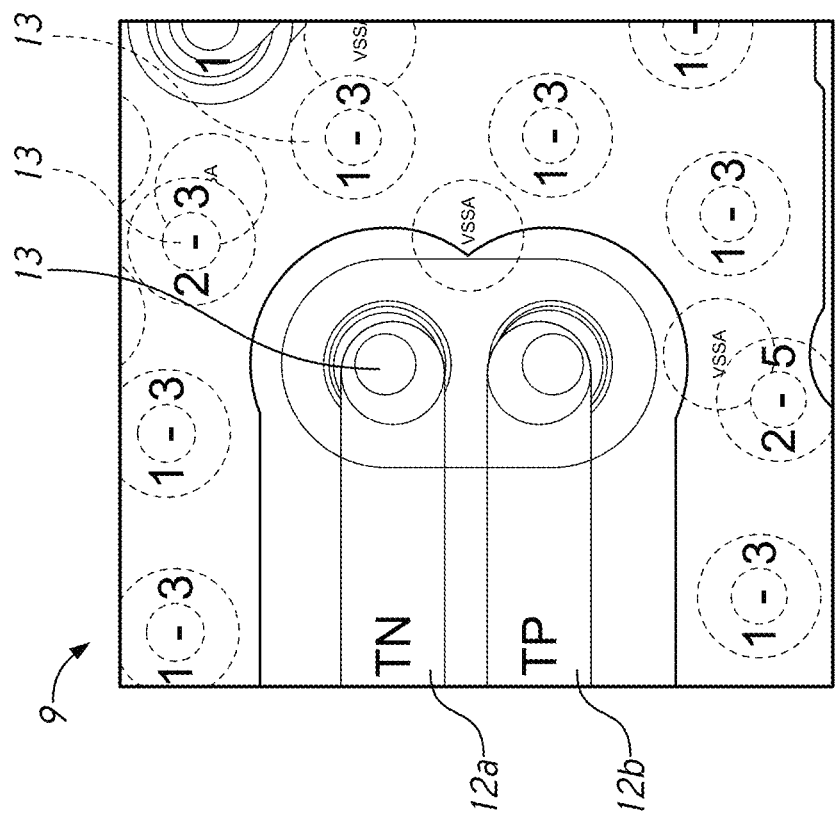
FIG. 2B
FIG. 2A

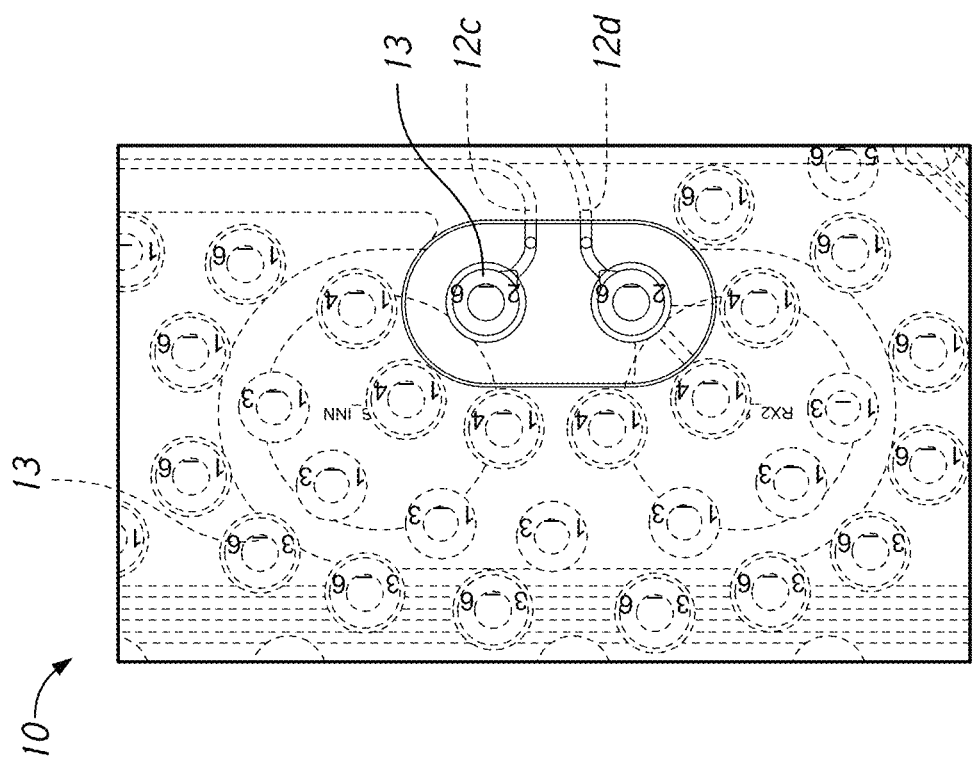
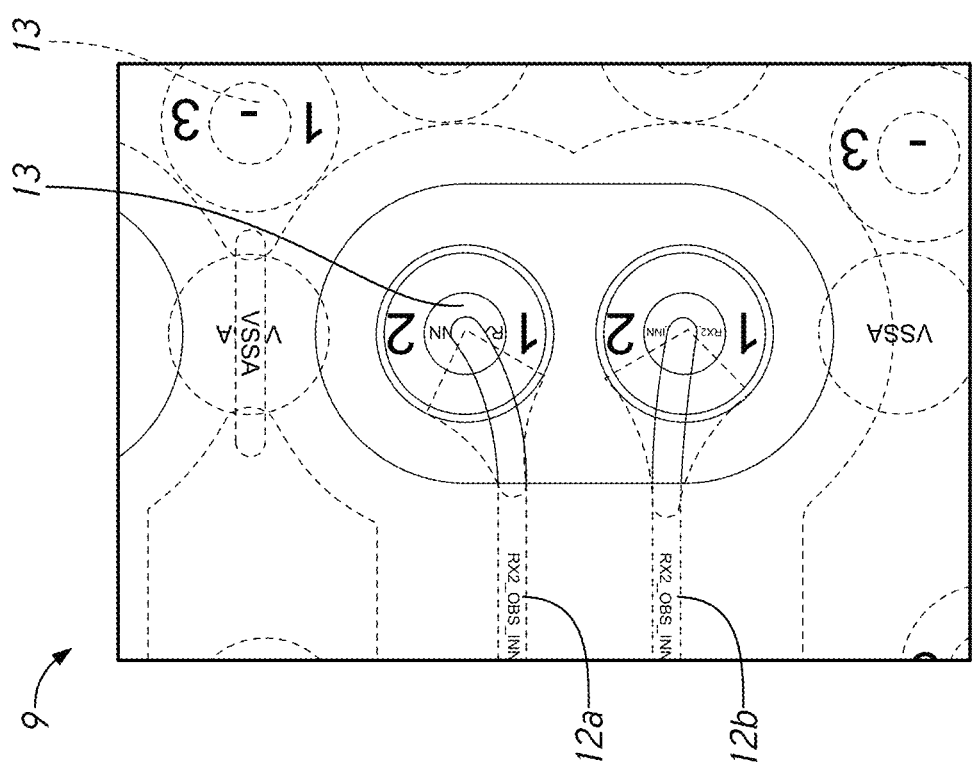
FIG. 3B
FIG. 3A

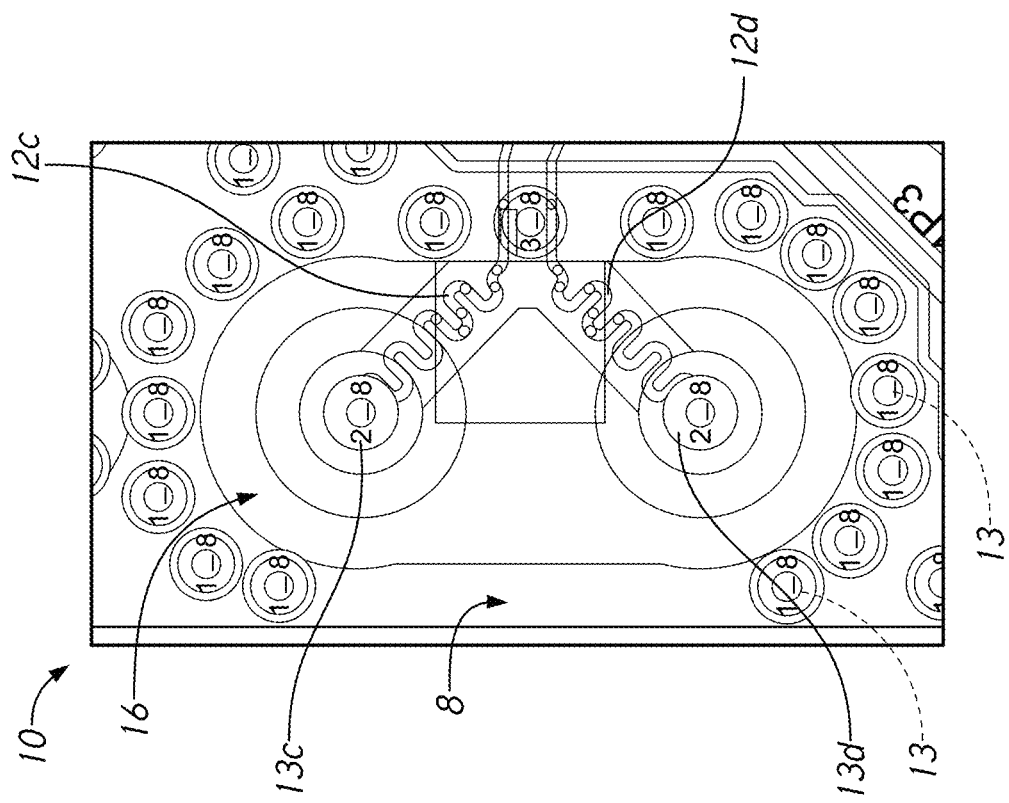
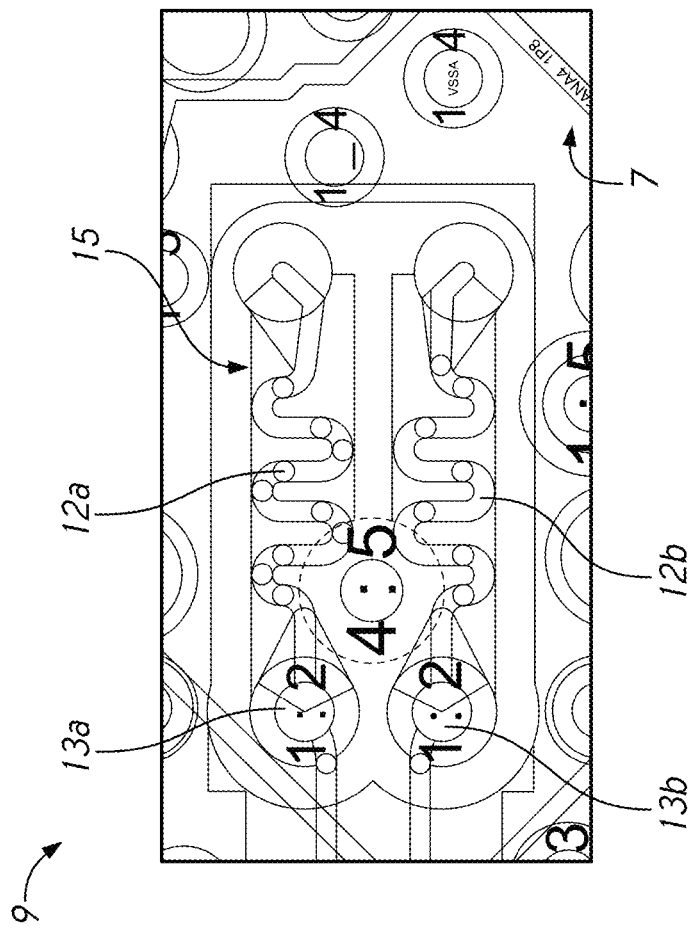
FIG. 5B
FIG. 5A

LAUNCH STRUCTURES FOR RADIO FREQUENCY INTEGRATED DEVICE PACKAGES

CROSS-REFERENCE TO RELATED APPLICATIONS

This application claims the benefit of U.S. Provisional Application No. 62/677,549 entitled "LAUNCH STRUCTURES FOR RADIO FREQUENCY INTEGRATED DEVICE," filed May 29, 2018, the entire disclosure of which is incorporated herein by reference for all purposes.

BACKGROUND

Field

The field relates to launch structures for radio frequency integrated device packages.

Description of the Related Art

Radio frequency (RF) integrated device dies and packages are used for high frequency communication applications, including radio-on-chip products, for wirelessly transmitting and/or receiving RF signals. The RF integrated device die can be mounted to a package substrate for incorporation into a larger electronic device or system. However, in some arrangements, the electrical interface between the integrated device die and the package substrate, or between the package substrate and the larger system, may be inefficient so as to produce losses that degrade the performance of the system. Accordingly, there remains a continuing need for improved RF integrated device packages.

SUMMARY

In one aspect, an integrated device package is disclosed. The integrated device package includes a laminate substrate that has a front side and a back side. The laminate substrate includes a plurality of layers. The integrated device package also includes an integrated device die that is mounted to the front side of the laminate substrate. The integrated device die includes radio frequency (RF) circuitry and has a first impedance. The integrated device die operates at one or more operational frequencies. The integrated device package further includes a plurality of conductive bumps that are disposed between the integrated device die and the front side of the laminate substrate. The conductive bumps are electrically connects the integrated device die and the laminate substrate. The integrated device package further includes a bump launch structure that is defined at least in part by one or more layers at or near the front side of the laminate substrate. The bump launch structure includes metallic and insulating materials that are arranged in a first pattern that has a second impedance that is matched to the first impedance such that a voltage standing wave ratio (VSWR) of the bump launch structure is less than 4:1.

In one embodiment, the integrated device package further includes a ball launch structure that is defined at least in part by one or more layers at or near the back side of the laminate substrate. The ball launch structure can include metallic and insulating materials arranged in a second pattern having a third impedance. The integrated device package can further include one or more traces or vias that electrically connect the first pattern of the bump launch structure and the second pattern of the ball launch structure. The integrated device package can further include a plurality of solder balls that are electrically and mechanically connected to the back side of the laminate substrate. The ball launch structure can further include the plurality of solder balls. The integrated device package can further include a system board that has a fourth impedance. The laminate substrate can be mounted to a front side of the system board by way of the plurality of solder balls. The ball launch structure can further include one or more layers at or near the front side of the system board. The third and fourth impedances can be matched such that a voltage standing wave ratio (VSWR) of the ball launch structure is less than 5:1. At least one of the bump launch structure and the ball launch structure can include a plurality of metallic vias spaced apart by an insulator. The plurality of metallic vias can extend through one or more layers of the laminate substrate. Spacings between adjacent metallic vias can define a corresponding capacitance that defines at least in part the second impedance or the third impedance. At least one of the bump launch structure and the ball launch structure can include a serpentine metallic trace electrically connected with a metallic via. The metallic via can extend through one or more layers of the laminate substrate.

In one embodiment, wherein the bump launch structure further includes the plurality of conductive bumps.

In one embodiment, the integrated device die includes an underbump metallization (UBM) layer. The plurality of conductive bumps can be connected to the UBM layer. The bump launch structure can further include the UBM layer.

In one embodiment, wherein the one or more operational frequencies includes frequencies in a range of 0.5 GHz to 60 GHz.

In one embodiment, the RF circuitry of the integrated device die operates over a 0.5 dB bandwidth of frequencies, The second impedance can be substantially matched to the first impedance across the bandwidth. The 0.5 dB bandwidth can be in a range of DC to 75 GHz.

In one aspect, a laminate substrate for supporting a radio frequency (RF) integrated device die that is configured to operate at one or more operational frequencies is disclosed. The laminate substrate has a front side and a back side opposite the front side. The laminate substrate includes a bump launch structure that is defined at least in part by one or more layers at or near the front side of the laminate substrate. The bump launch structure includes metallic and insulating materials that are arranged in a first pattern having a first impedance at the one or more operational frequencies. The first impedance of the bump launch structure is configured to substantially match an impedance of the RF integrated device die that has radio frequency (RF) circuitry. The laminate substrate also includes a ball launch structure that is defined at least in part by one or more layers at or near the back side of the laminate substrate. The ball launch structure includes metallic and insulating materials that are arranged in a second pattern having a second impedance at the one or more operational frequencies. The second impedance of the ball launch structure is configured to substantially match an impedance of a system board. The laminate substrate further includes one or more traces or vias that electrically connect the bump launch structure and the ball launch structure.

In one embodiment, the laminate substrate further includes a plurality of solder balls electrically and mechanically connected to the back side of the laminate substrate. The ball launch structure can further include the plurality of solder balls.

In one embodiment, the one or more operational frequencies are in a range of DC to 75 GHz.

In one embodiment, at least one of the bump launch structure and the ball launch structure includes a plurality of metallic vias spaced apart by an insulator. The plurality of metallic vias can extend through one or more layers of the laminate substrate.

In one embodiment, at least one of the bump launch structure and the ball launch structure can include a serpentine metallic trace electrically connected with a metallic via. The metallic via can extend through one or more layers of the laminate substrate.

In one aspect, an electronic device is disclosed. The electronic device includes a system board that has a first radio frequency (RF) communications line. The first RF communications line has a first impedance at one or more operational frequencies. The electronic device also includes a laminate substrate that is mounted to the system board. The laminate substrate has a front side and a back side opposite the front side. The electronic device also include a plurality of solder balls that are disposed between the system board and the back side of the laminate substrate. The solder balls electrically connect the system board and the laminate substrate. The electronic device further includes a ball launch structure that is defined at least in part by one or more layers at or near the back side of the laminate substrate. The ball launch structure includes metallic and insulating materials that are arranged in a first pattern that has a second impedance at the one or more operational frequencies. The second impedance of the ball launch structure is matched to the first impedance of the first RF communications line such that a voltage standing wave ratio (VSWR) of the ball launch structure is less than 5:1.

In one embodiment, the electronic device further includes an integrated device die that is mounted to the laminate substrate by way of one or more conductive bumps. The integrated device die can include radio frequency (RF) circuitry and have a third impedance. The electronic device can further include a bump launch structure that is defined at least in part by one or more layers at or near the front side of the laminate substrate. The bump launch structure can include metallic and insulating materials that are arranged in a second pattern that has a fourth impedance that is matched to the third impedance such that a voltage standing wave ratio (VSWR) of the bump launch structure is less than 3:1.

BRIEF DESCRIPTION OF THE DRAWINGS

Specific implementations of the invention will now be described with reference to the following drawings, which are provided by way of example, and not limitation.

FIG. 2A is a schematic top plan view of a bump interface region at or near the front side of a package substrate, in which the bump interface region is configured to connect to a transmission line structure of the die.

FIG. 2B is a schematic top plan view of a ball interface region at or near the back side of the package substrate, in which the ball interface region is configured to connect to a transmission line structure of the system board.

FIG. 3A is a schematic top plan view of a bump interface region at or near the front side of a package substrate, in which the bump interface region is configured to connect to a receiver line structure of the die which is connected to the receiver of the die.

FIG. 3B is a schematic top plan view of a ball interface region at or near the back side of the package substrate, in which the ball interface region is configured to connect to a receiver line structure of the system board.

FIG. 5A is a schematic top plan view of a bump interface region at or near the front side of a package substrate, in which the bump interface region is configured to connect to a receiver line structure of the die, according to various embodiments.

FIG. 5B is a schematic top plan view of a ball interface region at or near the back side of the package substrate, in which the ball interface region is configured to connect to a receiver line structure of the system board, according to various embodiments.

DETAILED DESCRIPTION

Figure 1A:
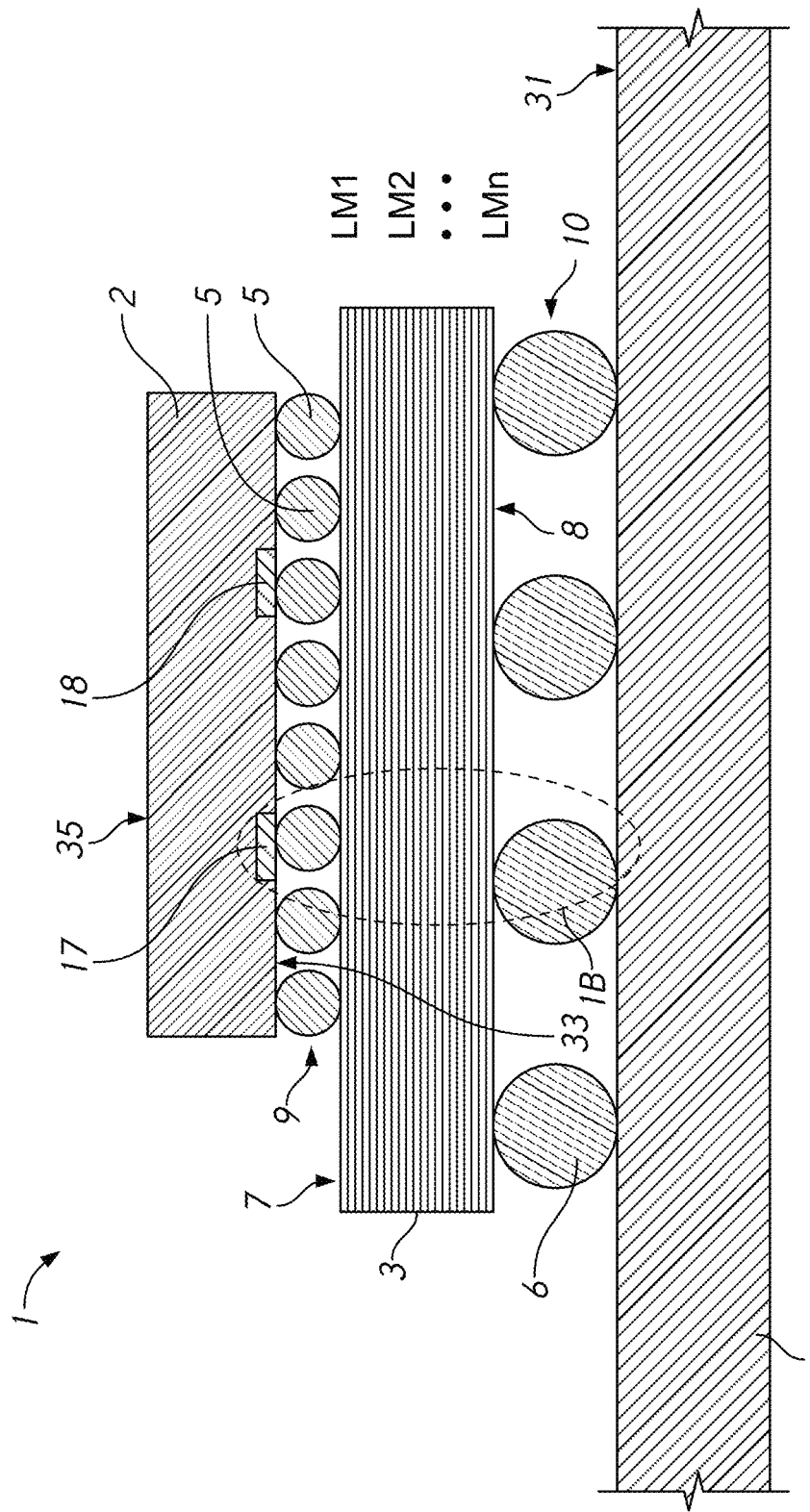
FIG. 1A is a schematic side sectional view of an RF integrated device package, according to various embodiments.

Various embodiments disclosed herein relate to radio frequency (RF) integrated device packages and for launch structures that improve the performance of wireless communications systems. FIG. 1A is a schematic side sectional view of an RF integrated device package 1, according to various embodiments. The RF package 1 can include an RF integrated device die 2 configured to operate at one or more operational frequencies, e.g., frequencies in a range of 0 Hz to 40 GHz, or up to 60 GHz. The RF integrated device die 2 can be mounted and electrically connected to a front side 7 of a package substrate 3 by way of one or a plurality of conductive bumps 5 (e.g., solder bumps, copper pillars, etc.) provided at a back side 33 of the die 2, for example, in a flip chip mounting technique. In various embodiments, active circuitry of the die 2 may be provided at or near the back side 33 of the die 2. In some embodiments, active circuitry of the die 2 may be provided at or near an opposite front side 35 of the die 2. The package substrate 3 can comprise any suitable type of package substrate, including, e.g., a laminate substrate (such as a printed circuit board, or PCB), a ceramic substrate, etc. In the illustrated embodiment, the substrate 3 comprises a laminate substrate with multiple patterned metal and dielectric layers LM1, LM2, . . . LMn. A back side 8 of the package substrate 3 can be mounted to a front side 31 of the system board 4 (e.g., motherboard) by way of a plurality of solder balls 6. The system board 4 can serve as an interface to a larger electronic device or system.

The RF integrated device die 2 can comprise one or a plurality of communications lines. In some embodiments, for example, the RF integrated device die 2 can comprise a receiver 17 configured to receive and process signals transmitted from another device, and/or a transmitter 18 configured to transmit signals wirelessly to another device. The receiver 17 can electrically connect to the conductive bump(s) 5 by way of a receiver line structure (not shown) defined in the die 2, and the transmitter 18 can electrically connect to the conductive bump(s) 5 by way of a transmitter line structure (not shown) defined in the die 2. The communication line structures (e.g., the respective receiver and/or transmitter line structures) may have associated impedance(s) at the operational frequencies of the package. Electrical signals can pass between the communication lines of the die 2 and upper metallic layer(s) of the package substrate 3 by way of the conductive bumps 5. The signals can pass through the package substrate 3 (e.g., through patterned metallic traces and vias). The signals can pass between the package substrate 3 and the system board 4 by way of the solder balls 6. In some embodiments, the die 2 can comprise a receiver 17 but no transmitter, while in other embodiments, the die 2 can comprise a transmitter 18 but no receiver. In some embodiments, the die 2 can comprise both the receiver 17 and the transmitter 18. In some embodiments, the die 2 can comprise multiple receivers 17 and/or multiple transmitters 18. In various embodiments, the die 2 can comprise one or more high speed digital links (e.g., JESD204 links) that can serve as a high speed digital interface.

As shown in FIG. 1A, the package 1 can comprise a bump interface region 9 that defines an electrical interface between the back side 33 of the die 2 and the front side 7 of the package substrate 3, and a ball interface region 10 that defines an electrical interface between the back side 8 of the package substrate 3 and the front side 31 of the system board 4. In some packages, the bump interface region 9 may provide poor impedance matching between the communications lines of the receiver 17 and/or transmitter 18 on the die 2 and corresponding metallic pads on the front side 7 of the substrate 3. Similarly, in some packages, the ball interface region 10 may provide poor impedance matching between metallic pads on the back side 8 of the package substrate 3 and corresponding pads on the system board 4. In such packages with mismatched impedance(s), the electrical performance of the package 1 can be significantly degraded. For example, a substantial amount of electrical energy can be lost due to parasitic effects in packages with mismatched impedance(s) at the bump or ball interface regions 9, 10.

Accordingly, in various embodiments disclosed herein, the bump interface region 9 can comprise a bump launch structure 15 (see FIG. 1B) that substantially matches the impedance of the communications lines (e.g., the transmitter and/or receiver lines) formed in the die 2 with the impedance of the metallic traces and/or vias of the package substrate 3, across the operational frequency(ies) of the package 1. Similarly, in various embodiments, the ball interface region 10 can comprise a ball launch structure 16 (see FIG. 1B) that substantially matches the impedance of the metallic traces and/or vias of the package substrate 3 with the impedance of the metallic pads of the system board 4, across the operational frequency(ies) of the package 1. By matching the impedances at the bump and ball interface regions 9, 10, the embodiments disclosed herein can substantially improve the performance of the RF package. As explained herein, layers of the bump and ball interfaces 9, 10 can be patterned (e.g., patterned metal and dielectric layers) to define the launch structures 15, 16 to enhance the performance of the package 1 by tuning the system inductance and capacitance to account for parasitic losses, e.g., capacitive losses, etc.

Figure 1B:
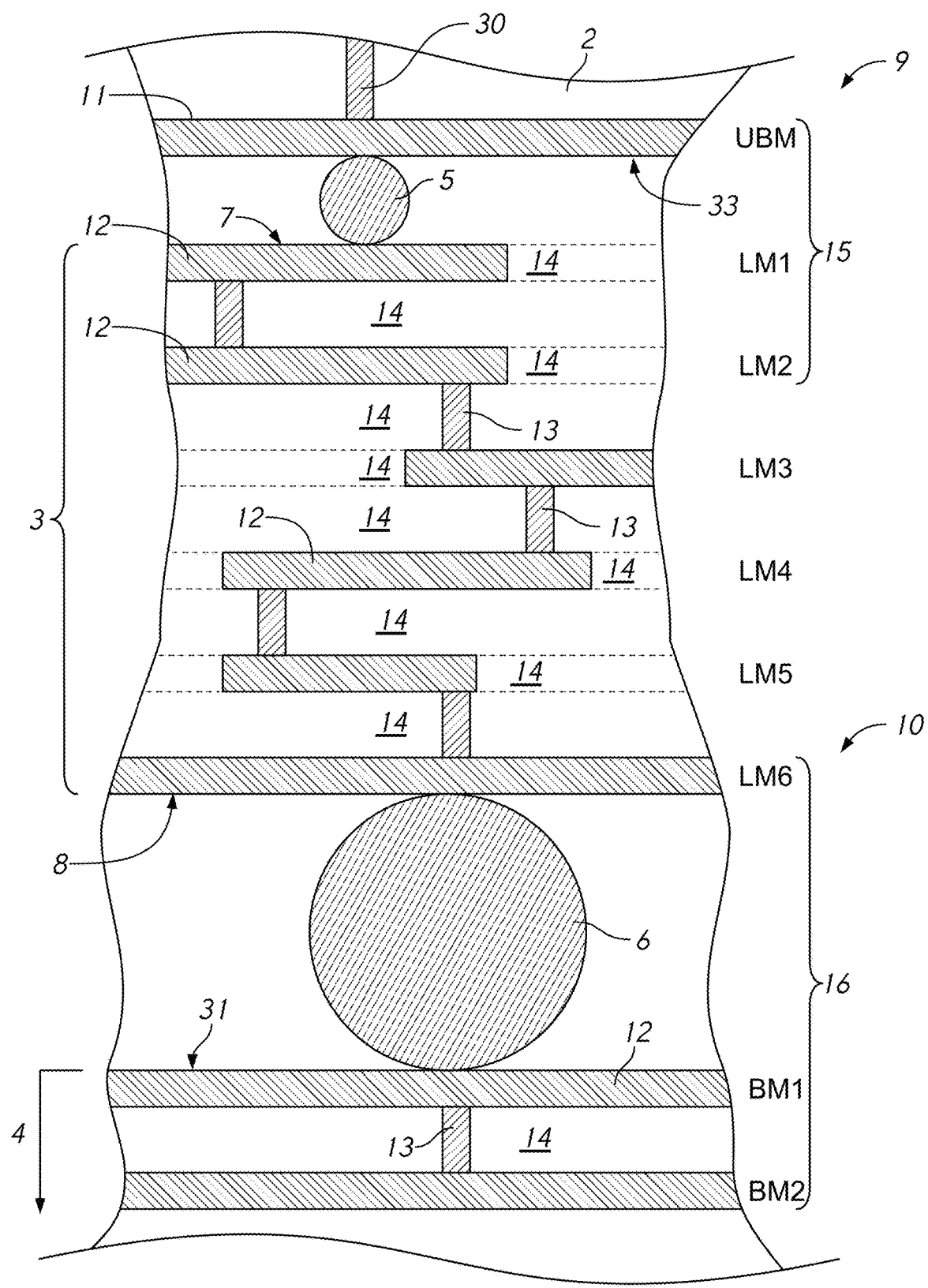
FIG. 1B is a schematic side sectional view of bump and ball interface regions that can comprise bump and ball launch structures, according to various embodiments.

FIG. 1B is a schematic side sectional view of the bump and ball interface regions 9, 10 that comprises bump and ball launch structures 15, 16, according to various embodiments. In particular, FIG. 1B illustrates a lower portion of the integrated device die 2, the package substrate 3, the system board 4, a conductive bump 5 between and connecting the integrated device die 2 and the package substrate 3, and a solder ball 6 between and connecting the package substrate 3 and the system board 4. As shown in FIG. 1B, the integrated device die 2 can comprise an underbump metallization (UBM) layer 11 disposed at the back side 33 of the die 2. The UBM layer 11 can serve as an electrical interface between the die 2 and the substrate 3. Furthermore, in FIG. 1B, the die 2 can comprise a communications line structure 30 that provides electrical communication between the UBM layer 11 and the receiver 17 or transmitter 18 (not shown in FIG. 1B). As explained herein, the communications line structure 30 can comprise a receiver line that connects to a receiver, or a transmission line that connects to a transmitter. The communication structure 30 of the die 2 can have an impedance $Z_{die}$ which may vary with the operational frequency. Further, the die 2 can comprise various types of circuitry, including, e.g., transistors for the receiver and/or transmitter, and/or for high speed digital interfaces.

As shown in FIG. 1B, the package substrate 3 can comprise a multi-layered laminate substrate comprising a plurality of patterned metal layers (or laminate metal layers, LMx) LM1 . . . LMn. For example, as shown in FIG. 1B, the patterned layers can comprise a plurality of metallic traces 12 that extend laterally along a particular layer LMn and a plurality of metallic vias 13 that extend vertically to connect traces 12 in other layers LMn. Thus, as illustrated, the traces 12 can transfer electrical signals laterally or horizontally in the substrate 3 (e.g., generally parallel to a major lateral dimension of the substrate 3), and the vias 13 can transfer electrical signals vertically in the substrate 3 (e.g., generally non-parallel or perpendicular to the major lateral dimension of the substrate 3). In FIG. 1B, each via 13 is illustrated as connecting a particular layer to a layer directly above or below that particular layer, but in other embodiments, the vias 13 can pass through multiple layers, or through the entirety of the thickness of the substrate 3. An insulating dielectric material 14 can electrically separate portions of the vias 13 and traces 12. Thus, each layer of the substrate 3 can comprise a pattern defined by the arrangement of metal (e.g., whether a via 13 or trace 12) and dielectric 14 for that layer. Further, in FIG. 1B, the illustrated portion of the system board 4 may also include one or more board layers BM1, . . . BMm comprising one or a plurality of patterned metal and dielectric layers. The illustrated board 4 may also comprise a laminate substrate, according to some embodiments. Any suitable metal can be used for the traces 12 and vias 13, including, e.g., aluminum, copper, etc. Any suitable insulator can be used for the dielectric 14, including, e.g., FR-4 board, an epoxy, a ceramic, glass, etc.

In various packaging arrangements, the bump interface region 9 may introduce an electrical transition between the communication line 30 in the die 2 and the metallic layers of the package substrate 3. In such an electrical transition, the impedance $Z_{die}$ of the communications line 30 of the die 2 may differ from an impedance $Z_{bump}$ of the bump 5, an impedance $Z_{s1}$ at or near the front side 7 of the substrate 3, and/or an impedance of other structures in the substrate 3. Similarly, an impedance $Z_{s2}$ at or near the back side 8 of the substrate 3 may differ from an impedance $Z_{ball}$ of the solder ball 6 and/or an impedance $Z_{board}$ at or near the front side 31 of the system board 4 (e.g., at BM1, BM2, and/or the intervening dielectric 14). In instances in which the impedances are mismatched, significant electrical energy can be lost due to, e.g., parasitic effects, which can degrade overall RF performance.

Accordingly, in various embodiments disclosed herein, the bump interface region 9 can comprise the bump launch structure 15, which can comprise various layer(s) of the die 2, the conductive bump(s) 5, and various layer(s) at or near the front side 7 of the package substrate 3. In the illustrated embodiment, for example, the bump launch structure 15 can comprise the UBM layer 11 of the die 2, the bump(s) 5, the traces 12 at layers LM1 and LM2, and the via 13 connecting the traces 12 at LM1 and LM2. In other embodiments, however, the bump launch structure 15 can comprise more or fewer layers and/or structures. For example, in other embodiments, the bump launch structure 15 can comprise only layer(s) in the package substrate 3. Still other combinations may be suitable. An overall impedance $Z_{bump-launch}$ of the bump launch structure 15 can be selected so as to substantially match the impedance $Z_{die}$ of the communication line(s) 30 of the die 2. For example, as explained herein, the shapes, sizes, and/or spaces of the traces 12 and vias 13 can be selected so as to create a desired effective inductance and/or capacitance, which can result in a substantially matched impedance. In such embodiments, for example, the overall impedance $Z_{bump-launch}$ of the bump launch structure 15 can be selected such that the voltage standing wave ratio (VSWR) is less than 4:1, less than 3:1, less than 2:1 or less than 1.5:1. For example, the overall impedance $Z_{bump-launch}$ of the bump launch structure 15 can be selected such that the voltage standing wave ratio (VSWR) is in a range of 1:1 to 4:1, in a range of 1.05:1 to 4:1, in a range of 1:1 to 3:1, in a range of 1.05:1 to 3:1, in a range of 1:1 to 2.5:1, in a range of 1.05:1 to 2.5:1, in a range of 1:1 to 2:1 or in a range of 1.05:1 to 2:1, e.g., in a range of 1:1 to 1.75:1, in a range of 1:1 to 1.5:1, or in a range of 1.25:1 to 1.75:1.

Similarly, in various embodiments disclosed herein, the ball interface region 10 can comprise the ball launch structure 16, which can comprise various layer(s) at or near the back side 8 of the package substrate 3, the solder ball(s) 6, and various layer(s) at or near the front side 31 of the system board 4. In the illustrated embodiment, for example, the ball launch structure 16 can comprise the trace 12 at LM6 and the via 13 thereabove, the ball(s) 6, and the traces 12 and vias 13 at layers BM1 and BM2 of the board 4. In other embodiments, however, the ball launch structure 16 can comprise more or fewer layers and/or structures. For example, in other embodiments, the ball launch structure 16 can comprise only layer(s) in the package substrate 3. Still other combinations may be suitable. An overall impedance $Z_{ball-launch}$ of the ball launch structure 16 can be selected so as to substantially match the impedance $Z_{board}$ of communication line structure(s) in the system board 4. For example, as explained herein, the shapes, sizes, and/or spaces of the traces 12 and vias 13 in the substrate 3 can be selected so as to create a desired effective inductance and/or capacitance, which can result in a substantially matched impedance. In such embodiments, for example, the overall impedance $Z_{ball-launch}$ of the ball launch structure 16 can be selected such that the voltage standing wave ratio (VSWR) is less than 5:1, less than 4:1, less than 3:1 or less than 2.5:1. For example, the overall impedance $Z_{bump-launch}$ of the ball launch structure 16 can be selected such that the voltage standing wave ratio (VSWR) is in a range of 1:1 to 5:1, in a range of 1.05:1 to 5:1, in a range of 1:1 to 4:1, in a range of 1.05:1 to 4:1, in a range of 1:1 to 3.5:1, in a range of 1.05:1 to 3.5:1, in a range of 1:1 to 3:1, in a range of 1:1 to 2:1, e.g., in a range of 1:1 to 1.75:1, in a range of 1:1 to 1.5:1, or in a range of 1.25:1 to 1.75:1.

FIG. 2A is a schematic top plan view of a bump interface region 9 at or near the front side 7 of the package substrate 3 illustrated in FIGS. 1A and 1B, in which the bump interface region 9 is configured to connect to a transmission line structure of the die 2 (see FIG. 1A), which communicates with the transmitter 18 (see FIG. 1A). FIG. 2B is a schematic top plan view of a ball interface region 10 at or near the back side 8 of the package substrate 3 illustrated in FIGS. 1A and 1B, in which the ball interface region 10 is configured to connect to a transmission line structure of the system board 4 (see FIG. 1A). FIGS. 2A-2B illustrate only metallic or conductive structures of the bump and ball interface regions 9, 10, and do not illustrate the intervening dielectric material 14 shown in FIG. 1B. The dielectric material 14 may be disposed in the regions of FIGS. 2A-2B shown as voids. As shown in FIGS. 2A-2B, the bump and ball interface regions 9, 10 can respectively include one or a plurality of conductive traces 12 and vias 13 separated by intervening insulating or dielectric material (not shown in FIGS. 2A-2B). In the arrangement of FIGS. 2A-2B, layers illustrated in shadow underlie upper layers of the substrate 3.

As shown in FIG. 2A, the bump interface region 9 can comprise a pair of transmission traces 12a, 12b connected to corresponding vias 13 that pass through at least a portion of the thickness of the substrate 3. The pair of traces 12a, 12b can comprise balanced lines, which can be used in one of two modes, a differential mode (in which current runs out of phase) and a common mode (in which current runs in phase). In the arrangements of FIGS. 2A-2B (and indeed the other figures), vias that include numbers, such as 1-2, 2-3, or 2-5 illustrate the layers LM that the vias 13 electrically connect. For example, a via 13 with the label 1-2 over it provides electrical communication between layers LM1 and LM2. A via 13 with the label 2-3 provides electrical communication between layers LM2 and LM3. A via 13 with the label 2-5 provides electrical communication between layers LM2 and LM5, and so on. Thus, the transmission traces 12a, 12b at layer LM1 in FIG. 2A provide electrical communication between the bump (not shown in FIG. 2A) and the corresponding vias 13 for the transfer of a transmission electrical signal that is to be wirelessly transmitted to another device. The transmission signal may be transferred from the traces 12a, 12b at layer LM1 to layer LM2 by way of the 1-2 via 13 shown in FIG. 2A. The signal can communicate with the back side 8 of the substrate 3 by way of other traces and vias, which are not illustrated in FIG. 2A.

In the arrangement of FIG. 2A, the bump interface region 9 can have an associated impedance $Z_{bump\text{-}interface}$ that is mismatched from the impedance of the transmission lines (e.g., the communications line structure 30) of the die 2 (not shown in FIG. 2A). For example, in some packages, the transmission lines of the die 2 may have a nominal impedance value $Z_{die}$ in a range of about 30Ω to 60Ω, e.g., an impedance $Z_{die}$ of about 50Ω. The impedance $Z_{bump\text{-}interface}$ may have an impedance that differs from the transmission line impedance $Z_{die}$ such that the VSWR of the bump interface may be in a range of 3:1 to 5:1, or higher. For example, the transmission traces 12a, 12b of FIG. 2A can comprise relatively straight metallic structures that provide the shortest physical distance between the bump 5 and the vias 13. Moreover, the diameter and/or spacings of the vias 13 may not be selected to achieve a desired capacitance representative of an overall desired impedance. Thus, as explained above, the resulting impedance mismatch may result in reduced electrical performance of the package 1.

Similarly, the ball interface region 10 of FIG. 2B can comprise a pair of transmission traces 12c, 12d that connect to corresponding vias 13 at or near the back side 8 of the substrate 3, e.g., by way of two 2-6 vias that connect LM2 with LM6. As with the bump interface region 9, the transmission traces 12c, 12d may be relatively straight, and the diameter and/or spacing of the vias 13 may not be selected so as to achieve a desired capacitance. As with the bump interface region 10, the structures of FIG. 2B may result in an impedance mismatch relative to transmission lines in the system board 4 (not shown), which can further degrade overall electrical performance.

FIG. 3A is a schematic top plan view of a bump interface region 9 at or near the front side 7 of a package substrate 3 illustrated in FIGS. 1A and 1B, in which the bump interface region 9 is configured to connect to a receiver line structure of the die 2 (not shown) which is connected to the receiver 17 of the die 2 (see FIG. 1A). FIG. 3B is a schematic top plan view of a ball interface region 10 at or near the back side 8 of the package substrate 3, in which the ball interface region 10 is configured to connect to a receiver line structure of the system board 4 (not shown). Unless otherwise noted, components of FIGS. 3A-3B may refer to components that are the same as or generally similar to like-numbered components of FIGS. 1A-2B. As with FIGS. 2A-2B, FIGS. 3A-3B illustrate only metallic or conductive structures of the bump and ball interface regions 9, 10, and do not illustrate the intervening dielectric material 14 shown in FIG. 1B. The dielectric material 14 may be disposed in the regions of FIGS. 3A-3B shown as voids. For example, as with FIGS. 2A-2B, the bump and ball interface regions 9, 10 may respectively include receiver traces 12a, 12b, 12c, 12d, and vias 13 that transfer electrical signals from the bump 5 at or near the front side 7 of the substrate 3 to the ball 6 at or near the back side 8 of the substrate 3. However, in various arrangements, the impedance $Z_{die}$ of the receiver communications line that communicates with the receiver 17 may have a different impedance than that of the transmitter communications line that communicates with the transmitter 18. For example, in various arrangements, the impedance $Z_{die}$ of the receiver communications line of the die 2 may be in a range of 80Ω to 120Ω, e.g., about 100Ω in some arrangements.

As with the interface regions 9, 10 for the transmission lines disclosed in FIGS. 2A-2B, the interface regions 9, 10 of FIGS. 3A-3B for the receiver lines may have respective impedances $Z_{bump\text{-}interface}$, $Z_{ball\text{-}interface}$ that are mismatched from the respective receiver communication lines of the die 2 and/or the system board 4, respectively. The resulting mismatch in impedance(s) can reduce signal quality and degrade system performance.

Figure 4B:
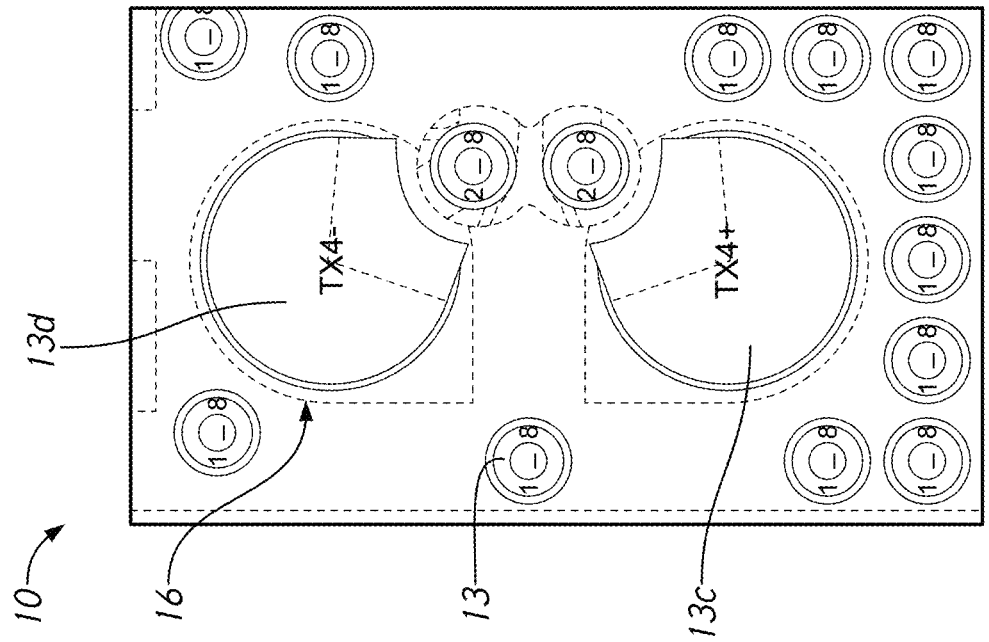
FIG. 4B is a schematic top plan view of a ball interface region at or near the back side of the package substrate, in which the ball interface region is configured to connect to a transmission line structure of the system board, according to various embodiments.
Figure 4A:
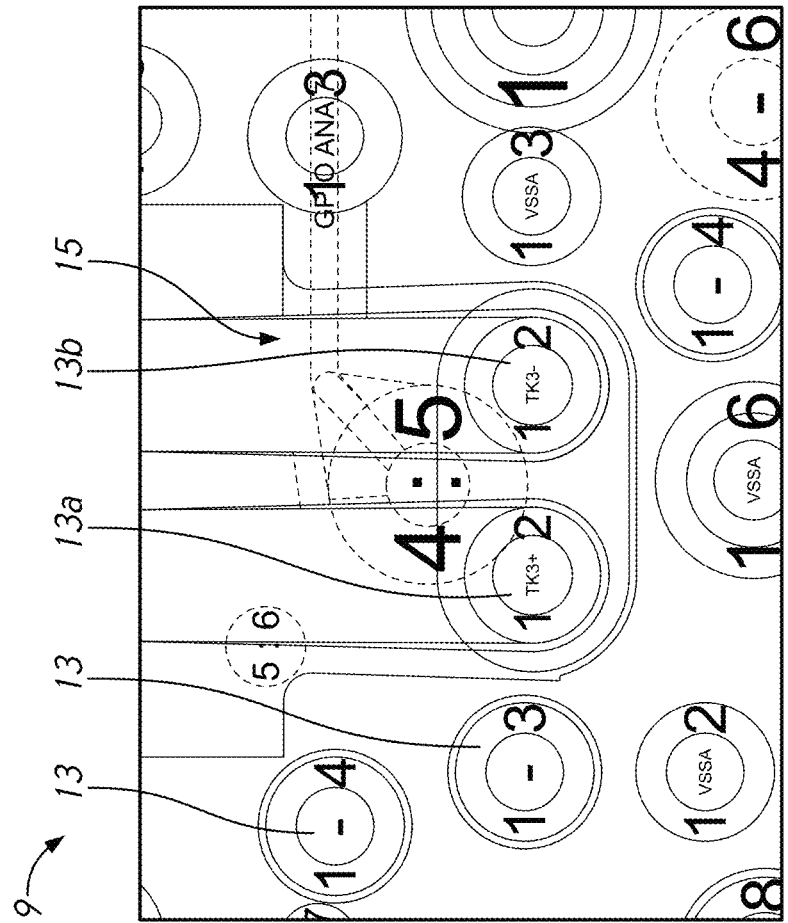
FIG. 4A is a schematic top plan view of a bump interface region at or near the front side of a package substrate, in which the bump interface region is configured to connect to a transmission line structure of the die, according to various embodiments.
Figure 4C:
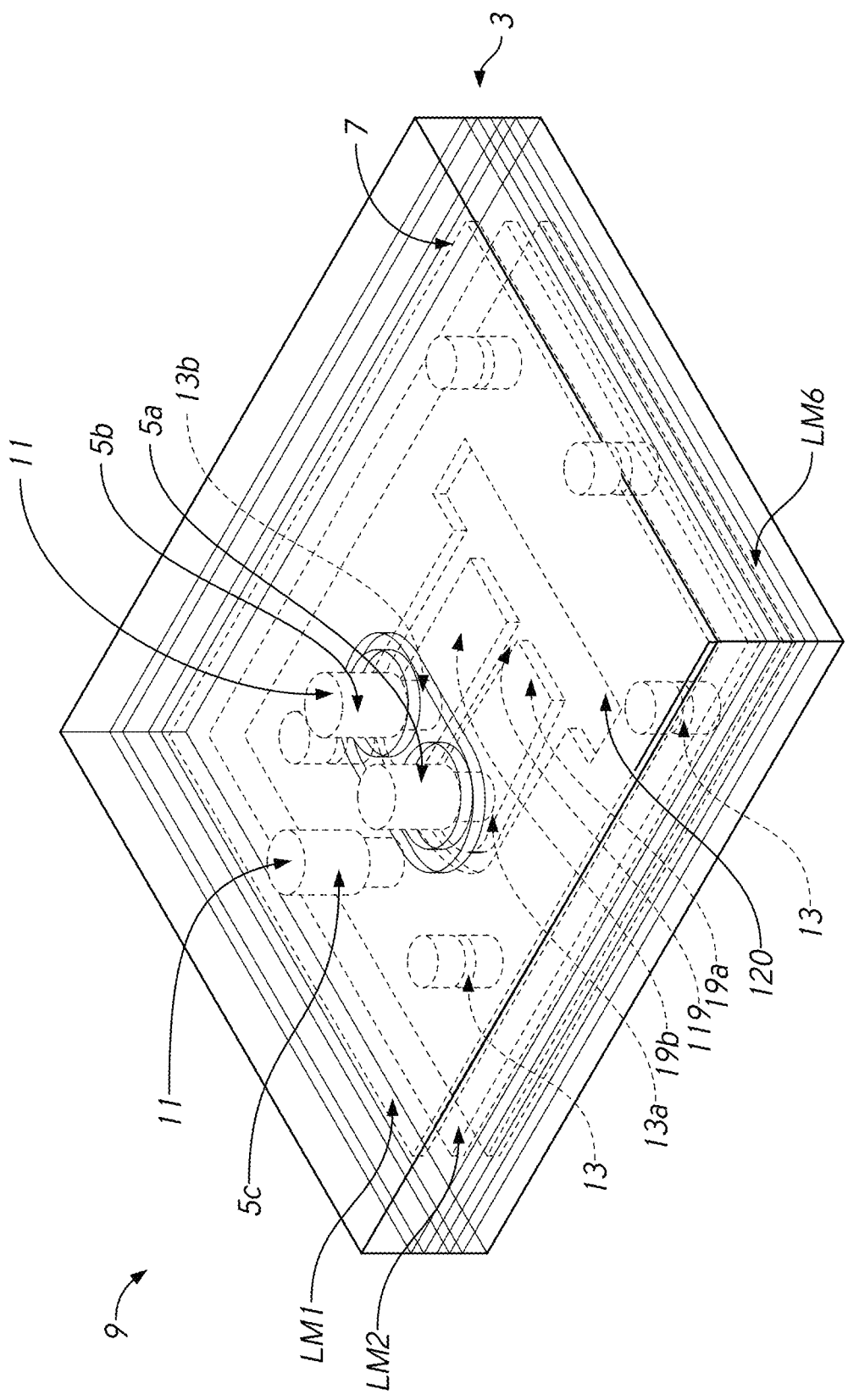
FIG. 4C is a schematic top perspective view of the bump interface region of FIG. 4A.
Figure 4D:
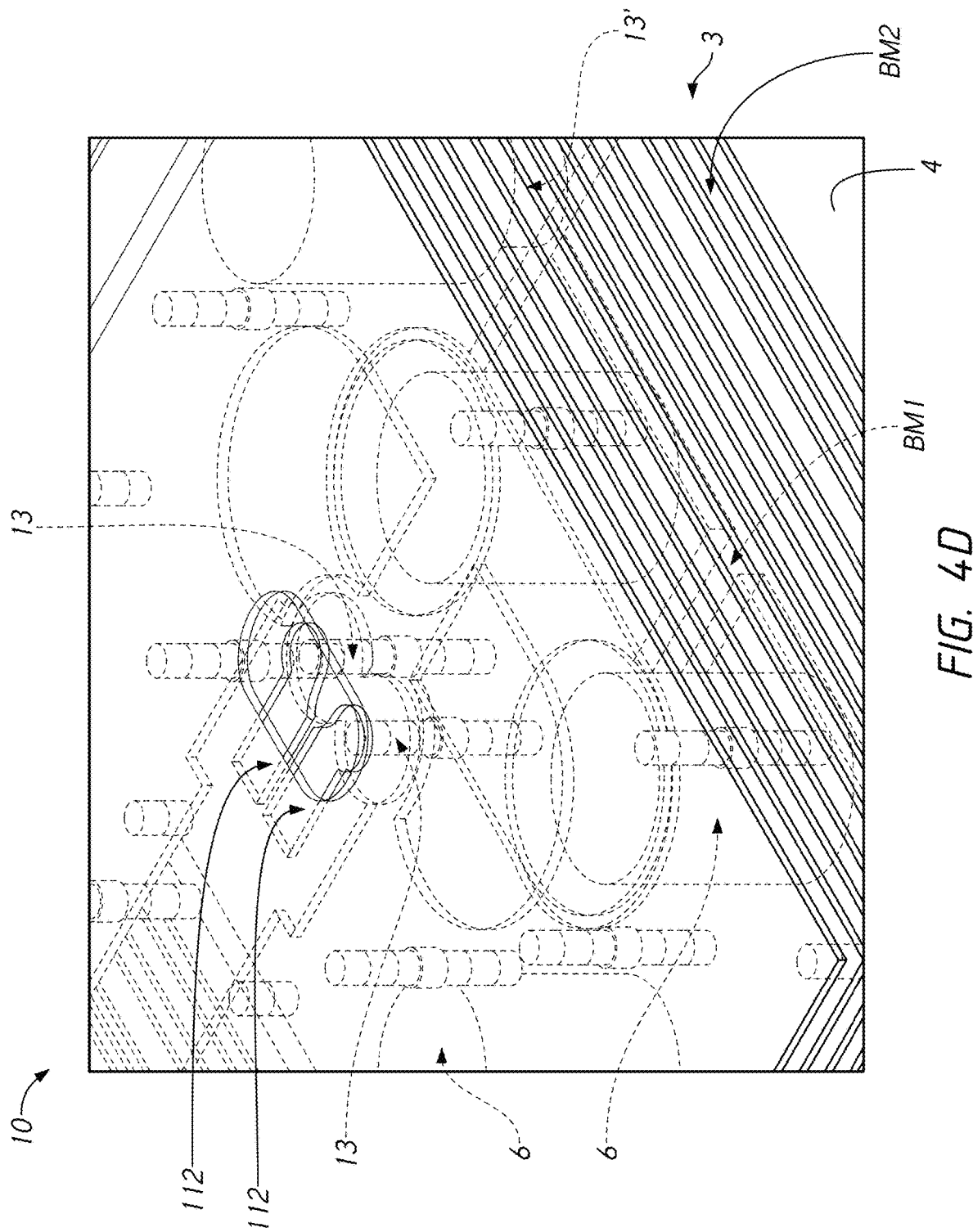
FIG. 4D is a schematic top perspective view of the ball interface region of FIG. 4B.

FIGS. 4A-4D illustrate an embodiment of bump and ball launch structures 15, 16 that provide improved impedance matching for transmission line structures of the die 2 and/or the system board 4 (see FIGS. 1A and 1B). In particular, FIG. 4A is a schematic top plan view of a bump interface region 9 at or near the front side 7 of a package substrate 3, in which the bump interface region 9 is configured to connect to a transmission line structure of the die 2, according to various embodiments. FIG. 4B is a schematic top plan view of a ball interface region 10 at or near the back side 8 of the package substrate 3, in which the ball interface region 10 is configured to connect to a transmission line structure of the system board 4, according to various embodiments. FIG. 4C is a schematic top perspective view of the bump interface region 9 of FIG. 4A. FIG. 4D is a schematic top perspective view of the ball interface region 10 of FIG. 4B.

As shown in FIG. 4A, the bump interface region 9 can comprise the bump launch structure 15 in which vias 13a, 13b are provided from the uppermost LM1 layer at the front side 7 of the substrate 3 to the LM2 layer below (e.g., a 1-2 via as illustrated), as shown in the schematic perspective view of FIG. 4C. As shown in FIG. 4C, for example, the vias 13a, 13b can connect LM1 to LM2. At the LM2 layer, conductive pads 19a, 19b can be patterned to connect to the vias 13a, 13b. Beneficially, the pads 19a, 19b can be shaped to obtain a desirable voltage standing wave ratio (VSWR) for the interface region 9. Transmission lines can connect the pads 19a, 19b to additional vias 13, which can transfer the signals to lower layers of the substrate 3, the ball launch structure 16, and to layer BM1 of the system board 4 by way of the solder balls 6. The vias 13a, 13b can be separated within an insulating field region (not shown). Similarly, the ball interface region 10 can comprise the ball launch structure 16 in which the vias 13c, 13d terminate at the back side 7 of the substrate 3 to connect to the solder balls 6, as shown in the schematic perspective view of FIG. 4D. The vias 13c, 13d can be separated within an insulating field region (not shown). In FIG. 4D, a plurality of launch metallic structures 112 can be shaped to transfer signals to corresponding vias 13 in the substrate 3. The vias 13 can transfer the signals down through the substrate 3 to the system board 4 by way of the solder balls 6 (see FIGS. 1A and 1B). Vias 13' in the board 4 can transfer signals down through portions of the system board 4. The launch metallic structure 112 can be shaped to define a desired capacitance for the ball launch structure 16.

Beneficially, the bump and ball launch structures 15, 16 of FIGS. 4A-4D can comprise patterns of metal and dielectric layer(s) that are structured so as to achieve an impedance that substantially matches the communication line(s) (e.g., the transmission line(s)) of the die 2 and of the system board 4, respectively. To pattern the launch structures 15, 16, the impedance $Z_{die}$ of the transmission line 30 of the die 2 can be determined. Based at least in part on the type of structure (e.g., single ended or balanced), it can determine the mode(s) in which the package 1 is likely to be operated. Thus, in the illustrated embodiment, a balanced line structure is shown. For the likely operating mode(s) (e.g., common or differential mode), the inductance (L) and capacitance (C) of the respective bump and ball launch structures 15, 16 can be selected based on a first-order approximation of impedance Z=sqrt(L/C). Thus, to create a bump or ball launch structure 15, 16 that substantially matches the impedance $Z_{die}$ of the communications line 30 (e.g., the transmission line in the embodiment of FIGS. 4A-4D), estimated values for inductance (L) and/or capacitance (C) may be selected so as to approximate $Z_{die}$ (within a desired range). Based at least in part on the estimated values for L and/or C, the layers of the bump and ball launch structures 15, 16 can be patterned so as to achieve the estimated L and/or C values, and, thus, the estimated impedance $Z_{bump\text{-}launch}$, $Z_{ball\text{-}launch}$ for the respective bump and ball launch structures 15, 16. The compensation techniques disclosed herein can be suitable for a wide range of impedances and/or operational frequencies. In various embodiments, for a particular operating frequency (or frequencies), a particular ball or bump launch structure can be designed. The designed ball or bump launch structure can be saved and used in additional, different packages that operate at similar frequencies or have other similar parameters.

In the embodiment of FIGS. 4A-4D, for example, the capacitance C of the bump and ball launch structures 15, 16 can be tuned by appropriately selecting the diameter and/or spacings of the vias 13a, 13b, 13c, 13d. For example, in a differential mode of operation, the spacing between vias 13a and 13b (and/or between vias 13c and 13d) can be adjusted to obtain a desired capacitance C for the launch structures. In some embodiments, a gap 119 between the conductive pads 19a, 19b can be adjusted to achieve a desired capacitance C, for example, for the differential mode of operation (see FIG. 4C). Similarly, a gap between portions of the launch metallic structures 112 (see FIG. 4D) can be adjusted to tune the capacitance C. In some embodiments, a gap 120 between the conductive pads 19 and a ground plane defined by LM2 (see FIG. 4C) can be tuned to achieve a desired capacitance C, for example, for a common mode of operation. In some embodiments, the vertical separation of the metallic layers can also be adjusted to achieve the desired capacitance C. In some embodiments, the materials of the dielectric layers 14 can be further selected so as to achieve the desired capacitance C and impedances $Z_{bump\text{-}launch}$, $Z_{ball\text{-}launch}$.

In various embodiments, portions of the launch structures 15, 16 can be tuned to achieve a desired inductance L, to improve impedance matching. For example, in various embodiments, adjusting the spacing of the vias 13a-13d can change the inductance L of the launch structures 15, 16. Moreover, in various embodiments, the inductance L can be modified by changing the length of the vias 13a-13d. For example, in some embodiments, a higher inductance L may be achieved by increasing a length of a particular via 13. Similarly, to modify the inductance L, the vias 13 can be formed to pass through any number of metal layers LM or BM. For example, in some embodiments, the inductance L may be increased by increasing the number of metallic layers LM or BM through which the vias 13 are disposed (e.g., providing a via 13 between LM1 and LM4, as opposed to between LM1 and LM3). As another example, the inductance L can be tuned or adjusted by modifying the spacing between the conductive bumps 5a-5c (see FIG. 4C). In FIG. 4C, bumps 5a and 5b can provide a signal pathway to the vias 13a, 13b. Bump 5c can provide a ground return path with the die 2. Adjusting the relative spacing between the bumps 5a, 5b, and 5c can also adjust the inductance L of the launch structures.

Figure 5C:
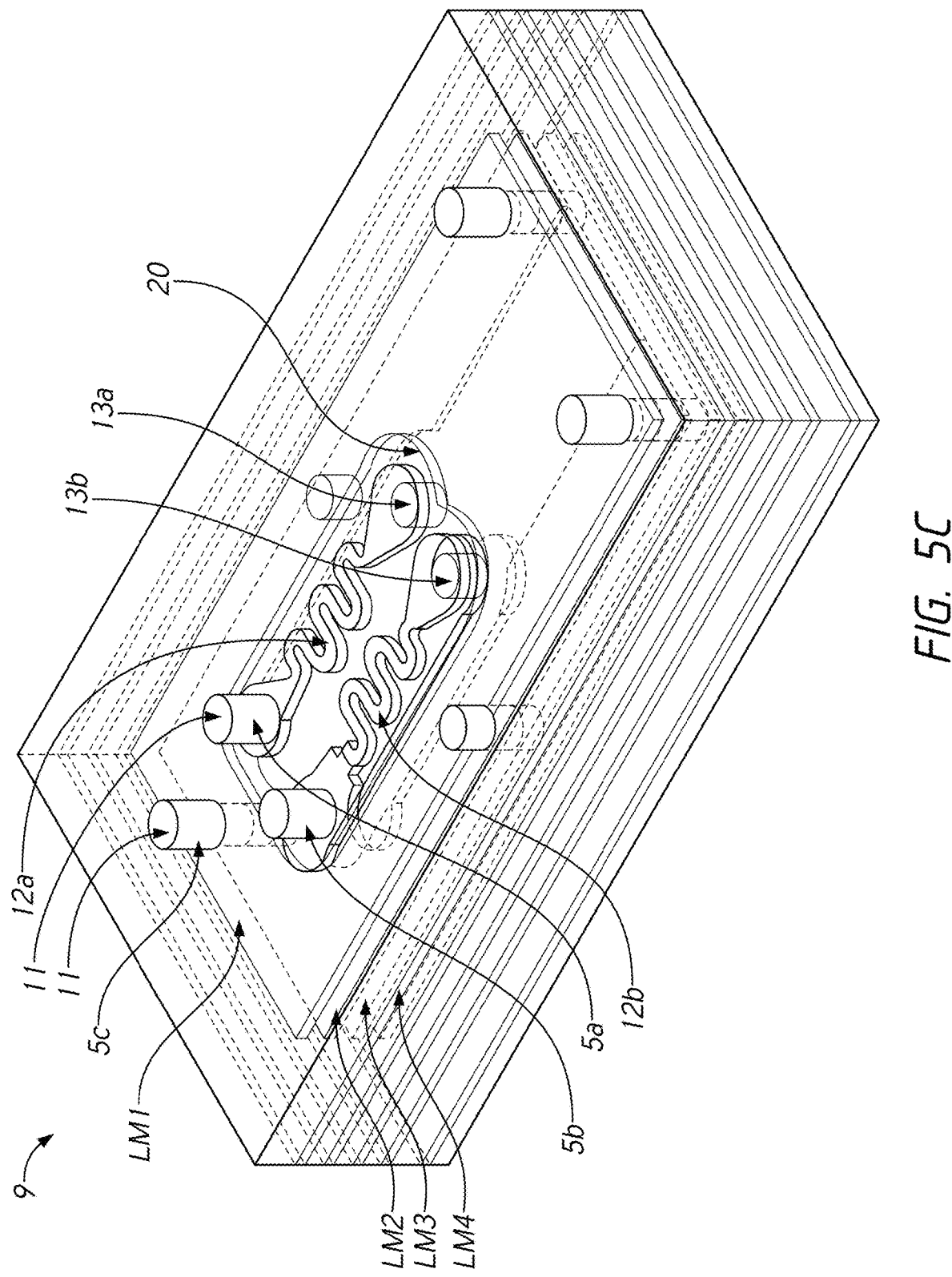
FIG. 5C is a schematic top perspective view of the bump interface region of FIG. 5A.
Figure 5D:
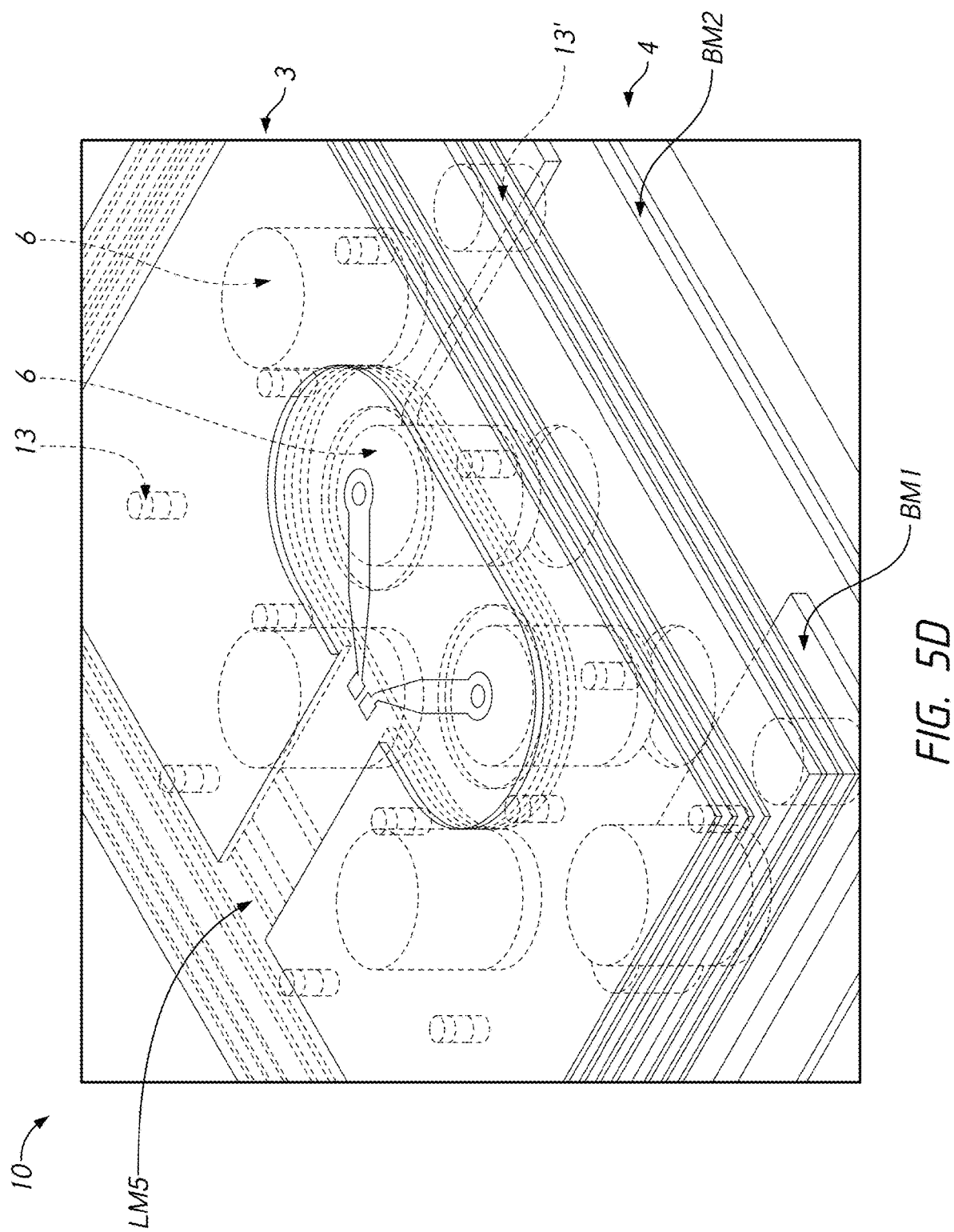
FIG. 5D is a schematic top perspective view of the ball interface region of FIG. 5B.
Figure 5E:
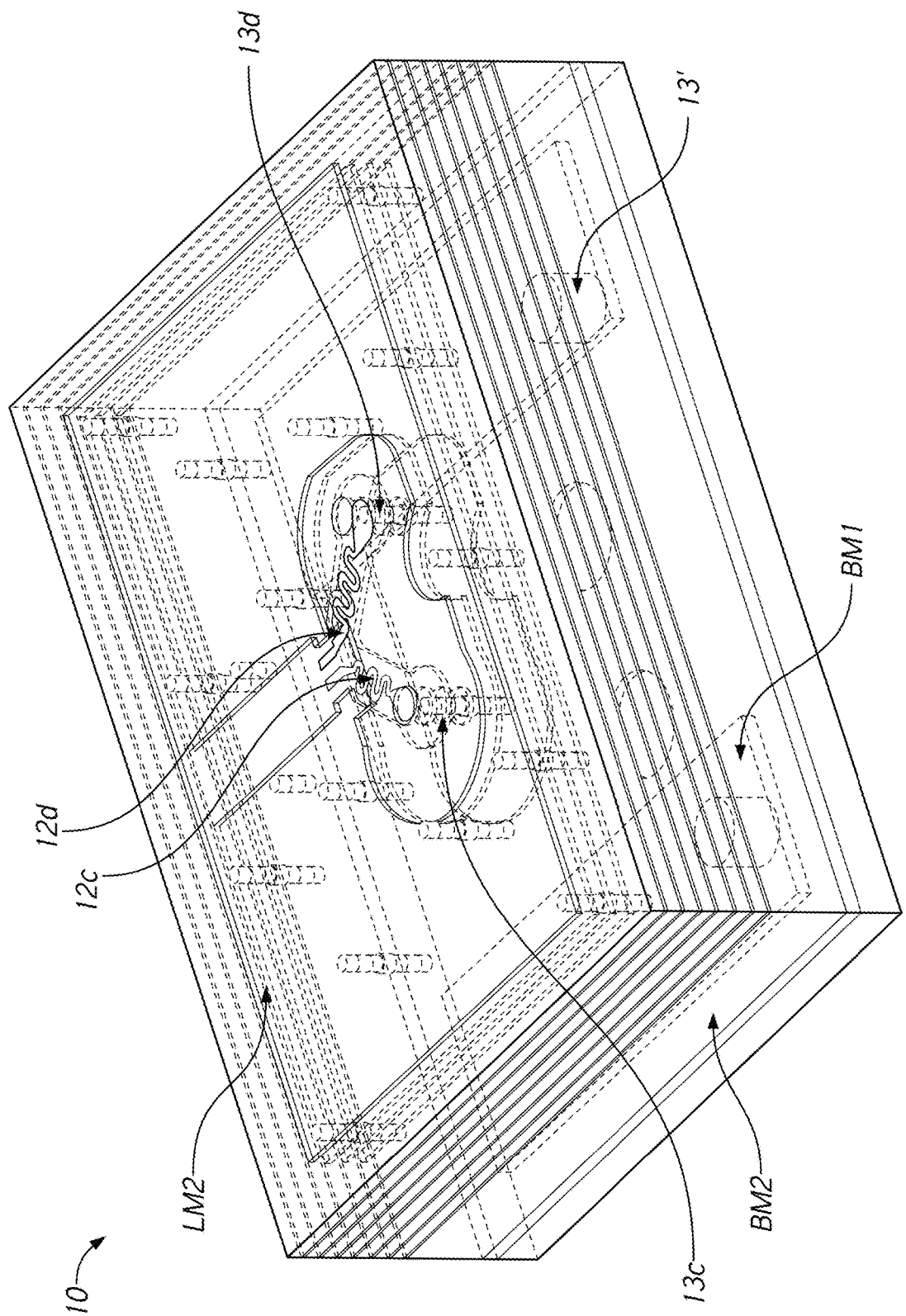
FIG. 5E is a schematic top perspective view of the ball interface region of FIG. 5B, illustrating from metal layer of the package substrate to board metal layer of the system board.

FIGS. 5A-5E illustrate an embodiment of bump and ball launch structures 15, 16 that provide improved impedance matching for receiver line structures (not shown) of the die 2 and/or the system board 4. In particular, FIG. 5A is a schematic top plan view of a bump interface region 9 at or near the front side 7 of a package substrate 3, in which the bump interface region 9 is configured to connect to a receiver line structure of the die 2, according to various embodiments. FIG. 5B is a schematic top plan view of a ball interface region 10 at or near the back side 8 of the package substrate 3, in which the ball interface region 10 is configured to connect to a receiver line structure of the system board 4, according to various embodiments. FIG. 5C is a schematic top perspective view of the bump interface region 9 of FIG. 5A. FIG. 5D is a schematic top perspective view of the ball interface region 10 of FIG. 5B, illustrating from metal layer 5 (LM5) of the package substrate 3 to board metal layer 2 (BM2) of the system board 4. FIG. 5E is a schematic top perspective view of the ball interface region 10 of FIG. 5B, illustrating from metal layer 2 (LM2) of the package substrate to board metal layer 2 (BM2) of the system board. As noted above, the impedance $Z_{die}$ of the receiver line of the die 2 may differ from the impedance $Z_{die}$ of the transmission line of the die 2. Accordingly, different bump and ball launch structures 15, 16 can be utilized to compensate for the varying impedances.

Unless otherwise noted, components of FIGS. 5A-5E may be the same as or similar to like numbered components of FIGS. 1A-4D. For example, as shown in FIGS. 5A-5B, the bump and ball launch structures 15, 16 can comprise metallic structures that can serve as inductance generation elements 12a, 12b, 12c, 12d configured to electrically connect to receiver communication lines in the die 2 or board 4 (see FIGS. 1A and 1B), respectively. Further, the inductance generation elements 12a-12d can connect to corresponding vias 13a-13d for providing vertical communication through the substrate 3. Beneficially, the length and/or curvature of the inductance generation elements 12a-12d can be adjusted to achieve a desired inductance L for the launch structures. For example, the inductance generation elements 12c, 12d may be longer and/or may have more turns than the inductance generation elements 12a, 12b, because, e.g., additional inductance is desired. Additionally, the inductance generation elements 12a-12d can be angled relative to one another so as to prevent interference with other components of the package or the larger electronic device. For example, in the ball launch structure 16 of FIG. 5B, the inductance generation elements 12c, 12d can be angled approximately orthogonally relative to one another so as to reduce interference with other systems (e.g., to prevent electrical coupling with other structures). By contrast, the inductance generation elements 12a, 12b of the bump launch structure 15 of FIG. 5A may be disposed generally parallel to one another, for example, if there are no sensitive components vertically adjacent the elements 12a, 12b. Thus, the inductance generation elements 12a-12d can comprise any suitable length and/or turns so as to adjust inductance, and the elements 12a-12d can be angled suitably so as to reduce electrical coupling or interference with other components. Further, as shown in FIG. 5C, one or more layers of the substrate 3 (e.g., LM3) can include a ground cutout region 20, in which the metallic layer, e.g., LM3, is patterned so as to further tune, for example, capacitance of the launch structure 15.

In the embodiment of FIGS. 5A-5E, the inductance generation elements 12a, 12b, 12c, 12d can comprise serpentine traces having a plurality of crests and troughs, e.g., a wave-like shape. Beneficially, the length, width, and/or curvature of the inductance generation elements 12a-12d can be selected so as to provide a desired inductance (L) of the bump and/or ball launch structures 15, 16. Further, the diameter and/or spacings of the vias 13 can be selected so as to provide a desired capacitance (C) of the bump and/or ball launch structures 15, 16. The respective inductance (L) and capacitance (C) values can be adjusted based at least in part on the impedance Z=sqrt(L/C) of the transmission line of the die 2. Beneficially, as with the embodiment of FIGS. 4A-4D for compensating the impedance(s) of an RF transmission line, the embodiment of FIGS. 5A-5E can beneficially match the impedance(s) of an RF receiver line. For example, as with FIGS. 4A-4D, in FIGS. 5A-5E, the spacing of the bumps 5a-5c can be adjusted to tune the inductance of the launch structure 15. Further, the length of the vias 13 can be adjusted, as explained above, to provide a desired inductance. The structures of FIGS. 5A-5E can generally be tuned in manners similar to those explained above in connection with FIGS. 4A-4D.

Beneficially, tuning the capacitance (C) and/or inductance (L) of the bump and ball launch structures 15, 16 of FIGS. 4A-5E can define respective bump and ball impedances $Z_{bump-launch}$, $Z_{ball-launch}$, respectively, that substantially match the impedance $Z_{die}$ of the transmission line structure of the die 2, and/or the impedance $Z_{board}$ of the transmission line structures of the system board 4. For example, the bump and ball launch impedances $Z_{bump-launch}$, $Z_{ball-launch}$ can be substantially matched with the impedance $Z_{die}$ of the transmission line structure of the die 2 as explained above, and/or substantially matched with the impedance $Z_{board}$ of the transmission line structures of the system board 4 as explained above. The impedances can be matched at the operational frequencies of the die 2, e.g., at frequencies up to 75 GHz, or up to 60 GHz, e.g., at frequencies up to 40 GHz. The impedances can further be matched across the bandwidth (e.g., a 0.5 dB bandwidth) of the operational frequency response, e.g., matched across substantially the entirety of a 0.5 dB bandwidth of 75 GHz, or up to 60 GHz, e.g., up to 40 GHz. In various embodiments, the impedances can be matched across the 0.5 dB bandwidth of the frequency response, e.g., matched across a bandwidth in a range of DC to 75 GHz, in a range of 0.5 GHz to 75 GHz, in a range of DC to 60 GHz, in a range of 0.5 GHz to 60 GHz, in a range of 0.5 GHz to 45 GHz, in a range of 1 GHz to 40 GHz, or in a range of 2 GHz to 6 GHz. Although various ranges of operational frequencies are provided herein, it should be appreciated that the embodiments disclosed herein can be employed with structures configured to operate at any suitable frequency. For example, structures employing a lower dielectric constant may be able to operate at higher frequencies. Various embodiments disclosed herein can utilize dielectric materials having a dielectric constant in a range of about 3.3. to 4.6, e.g., in a range of 3.3 to 3.8. Such structures can operate at frequencies in a range of DC to 75 GHz, in a range of DC to 60 GHz, in a range of 0.5 GHz to 60 GHz, in a range of 0.5 GHz to 50 GHz, or in a range of 0.5 GHz to 40 GHz.

Advantageously, therefore, the bump and ball launch structures 15, 16 can enable impedance matching between the communications line(s) 30 (e.g., transmission and/or receiver line(s)) of the die 2 and the substrate 3 (e.g., along the bump interface region 9), and between the substrate 3 and corresponding communication line(s) of the system board (e.g., along the ball interface region 10). The impedance matching can be configured to provide improved performance across a wide range of frequencies, such that the device die 2 can be operated across a wide range of frequencies without additional tuning to the system board 4. The die 2 and substrate 3 can be mounted to the system board 4 without providing additional tuning or other external components to tune the impedance. For example, in other arrangements that do not adequately impedance match the package 1 to the system board 4, it may be desirable to mount additional discrete components (e.g., passive devices, such as inductors, capacitors, resistors) to the system board 4 to assist in matching the impedance to the package 1. Such additional components increase assembly costs and processing time. Further, such additional matching components may utilize package-specific calculations in order to match the impedance of the package components to the system board 4. The embodiments disclosed herein obviate the need for additional impedance matching components by matching the impedance $Z_{die}$ of the communications line(s) 30 of the die 2 to the impedance $Z_{bump-launch}$ of the bump launch structure 15, and by matching the impedance $Z_{ball-launch}$ of the ball launch structure 16 to the impedance of the system board $Z_{board}$.

Figure 6A:
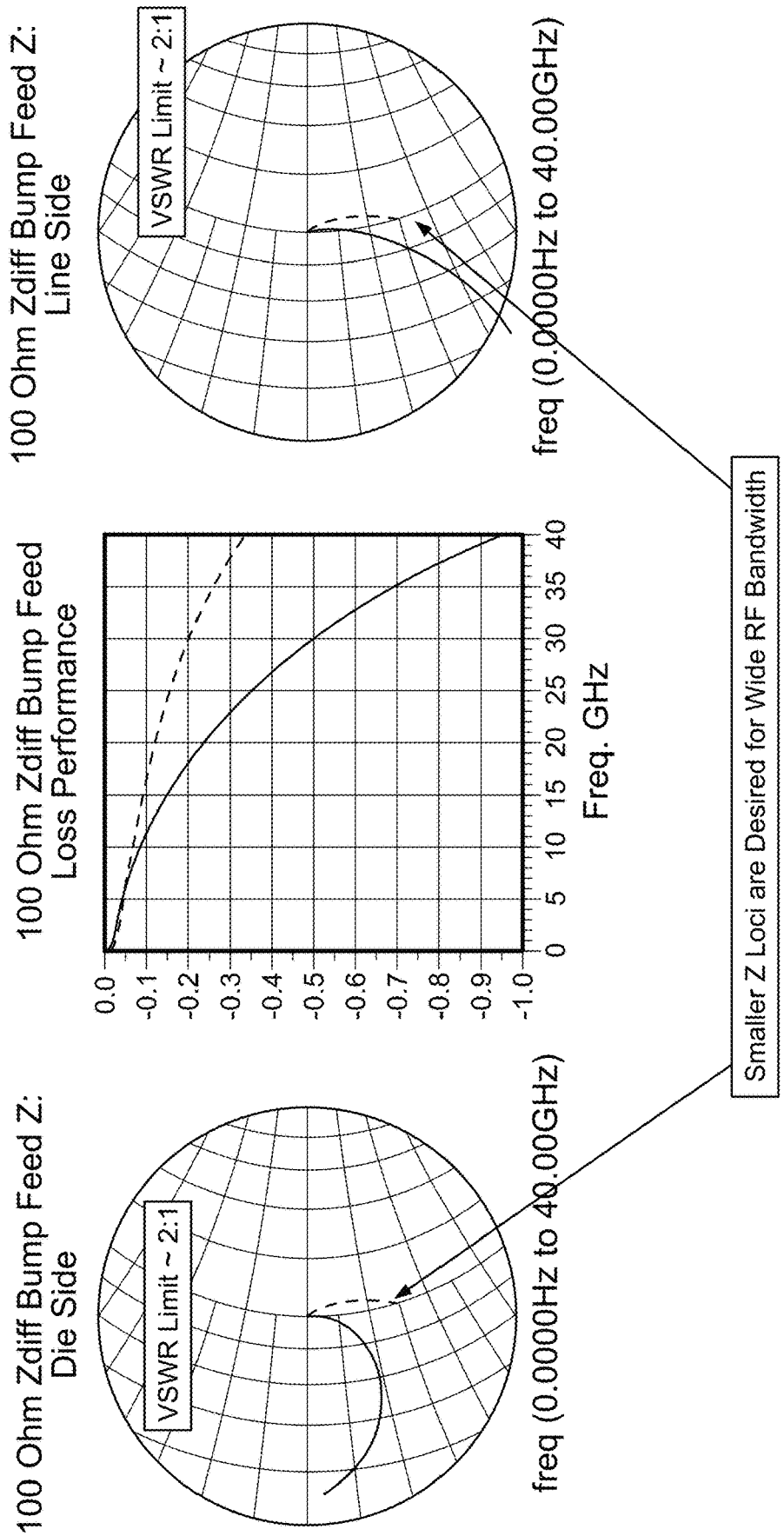
FIG. 6A illustrates plot showing the electrical performance of the bump and ball compensation or launch structures disclosed herein, according to one embodiment.

FIG. 6A illustrates a series of graphs (Smith charts) illustrating the performance of the bump launch structure 15 of FIG. 5A for compensating the impedance of a receiver transmission line (approximately 100 ohm impedance), as compared with the performance of the bump launch structure of FIG. 3A. As shown in the left hand side of FIG. 6A (the "die side" impedance ratio), the loci representative of the voltage standing wave ratio (VSWR) of the embodiment shown in FIG. 5A, shown in dashed line, can be substantially smaller than the VSWR of an uncompensated structure, shown in solid line. For example, as shown with dashed line on the left hand side of FIG. 6A, the VSWR of the structure shown in FIG. 5A can be less than 2.5:1 for operational frequencies up to about 40 GHz, or less than 2:1. For example, the VSWR of the bump launch structure shown in FIG. 5A can be in a range of 1:1 to 1.95:1, in a range of 1:1 to 1.75:1, in a range of 1:1 to 1.5:1, or in a range of 1:1 to 1.25:1.

Figure 6B:
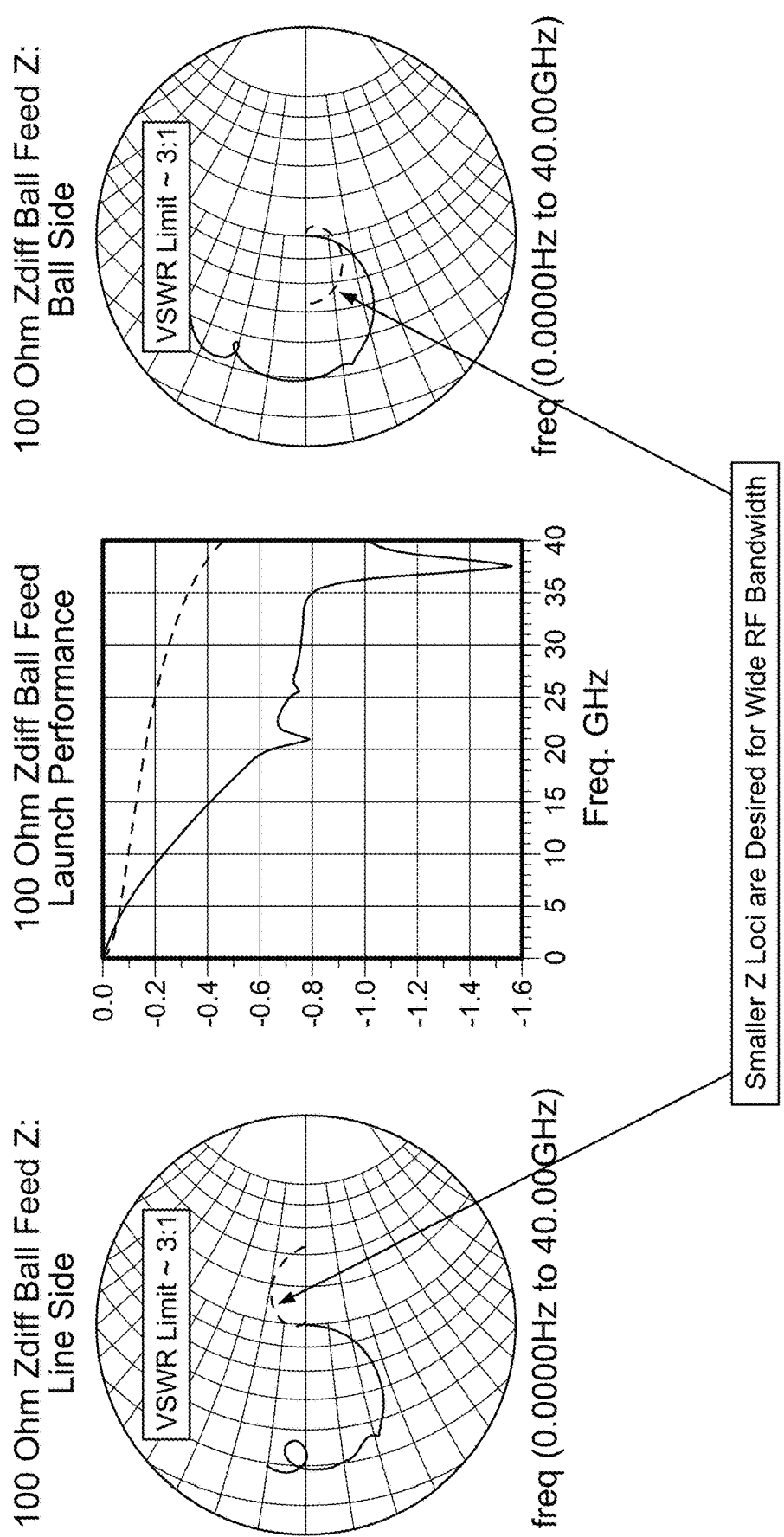
FIG. 6B illustrates plot showing the electrical performance of the bump and ball compensation or launch structures disclosed herein, according to another embodiment.

FIG. 6B illustrates a series of graphs illustrating the performance of the ball launch structure 16 of FIG. 5B for compensating the impedance of a receiver transmission line (approximately 100 ohm impedance), as compared with the performance of the ball launch structure of FIG. 3B. As shown in FIGS. 6A-6B, the smaller impedance loci (shown in dashed lines) indicates improved performance relative to other types of compensation structures (shown in solid lines). For example, as shown on the right hand side of the Smith chart of FIG. 6B, the VSWR of the ball launch structure shown in FIG. 5B can be less than 2.5:1 for operational frequencies up to about 40 GHz, or less than 2.25:1. For example, the VSWR of the ball launch structure shown in FIG. 5B can be in a range of 1:1 to 1.95:1, in a range of 1:1 to 1.75:1, in a range of 1:1 to 1.5:1, or in a range of 1:1 to 1.25:1.

Figure 6C:
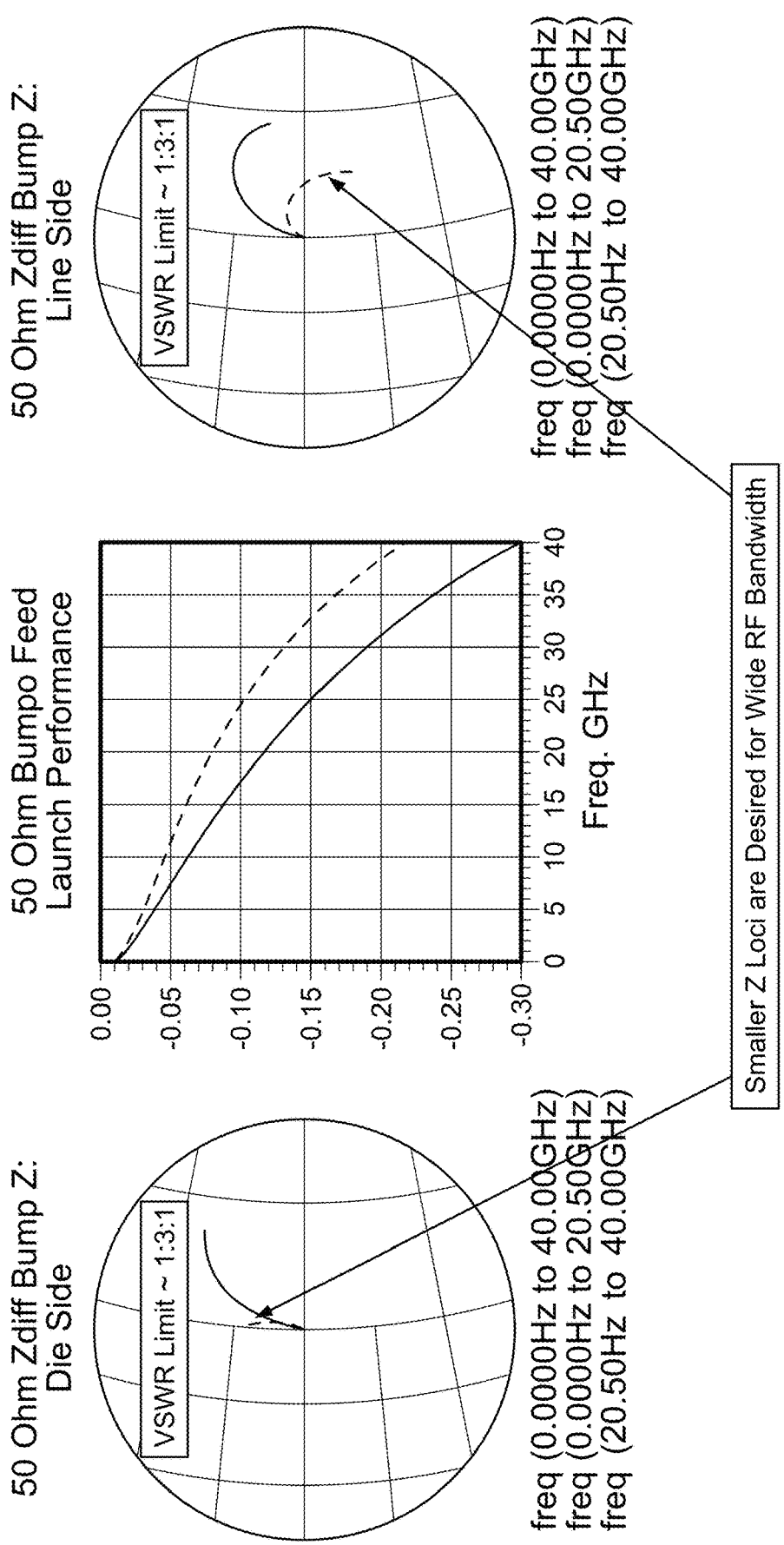
FIG. 6C illustrates plot showing the electrical performance of the bump and ball compensation or launch structures disclosed herein, according to another embodiment.

Similarly, FIG. 6C illustrates a series of graphs illustrating the performance of the bump launch structure 15 of FIG. 4A for compensating the impedance of a transmitter transmission line (approximately 50 ohm impedance), as compared with the bump launch structure of FIG. 2A. As shown on the left hand Smith chart (die side) of FIG. 6C, the VSWR of the bump launch structure shown in FIG. 4A, shown in dashed line, can be less than 2:1, or less than 1.5:1 for operational frequencies up to about 40 GHz, or less than 1.3:1. For example, the VSWR of the ball launch structure shown in FIG. 4A can be in a range of 1:1 to 1.5:1, in a range of 1:1 to 1.25:1, in a range of 1:1 to 1.2:1, or in a range of 1:1 to 1.1:1

Figure 6D:
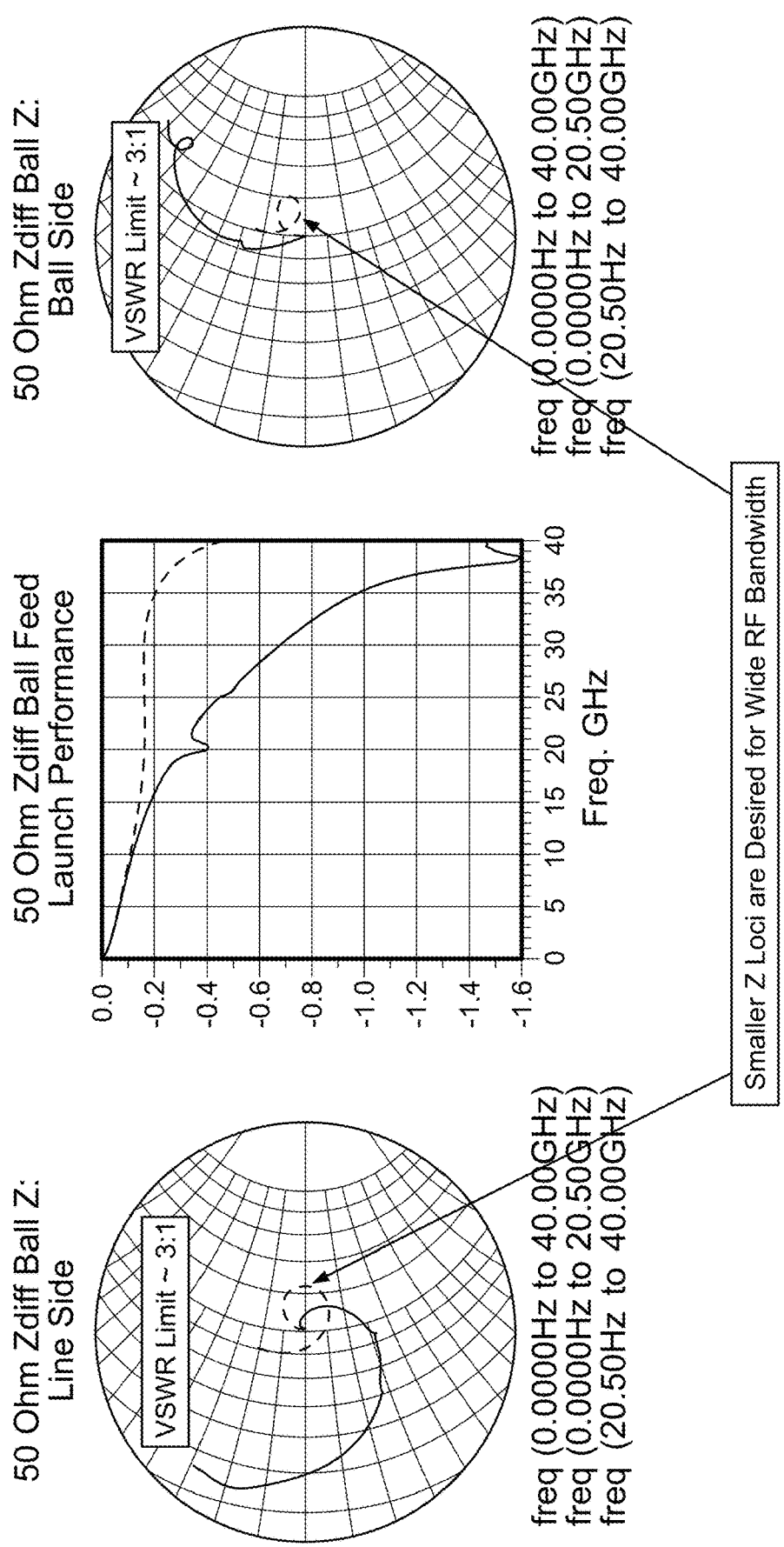
FIG. 6D illustrates plot showing the electrical performance of the bump and ball compensation or launch structures disclosed herein, according to another embodiment.

FIG. 6D illustrates a series of graphs illustrating the performance of the ball launch structure 16 of FIG. 4B for compensating the impedance of a transmitter transmission line (approximately a 50 ohm impedance), as compared with the bump launch structure of FIG. 2B. As with FIGS. 6A-6B, the graphs in FIGS. 6C-6D show a smaller impedance loci for the bump and ball launch structures 15, 16 disclosed herein, as compared with other structures. For example, as shown on the right hand side of FIG. 6D, the VSWR of the ball launch structure shown in FIG. 4B, shown in dashed line, can be less than 3:1 for operational frequencies up to about 40 GHz, less than 2.5:1, or less than 2:1 for frequencies up to 40 GHz. For example, as shown in the Smith chart on the right hand side of FIG. 6D, the VSWR of the bump launch structure shown in FIG. 4B, shown in dashed line, can be in a range of 1:1 to 2.2:1, in a range of 1:1 to 2:1, or in a range of 1:1 to 1.75:1. The Smith charts of FIGS. 6A-6D illustrate that the bump and ball launch structures disclosed herein can beneficially improve impedance matching as compared with other, uncompensated structures.

Although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

The invention claimed is:

1. An integrated device package comprising:
  a laminate substrate having a front side and a back side, the laminate substrate comprising a plurality of layers;
  an integrated device die mounted to the front side of the laminate substrate, the integrated device die comprising radio frequency (RF) circuitry and having a first impedance, the integrated device die operating at one or more operational frequencies;
  a plurality of conductive bumps disposed between the integrated device die and the front side of the laminate substrate, the conductive bumps electrically connecting the integrated device die and the laminate substrate; and
  a bump launch structure defined at least in part by one or more layers at or near the front side of the laminate substrate, the bump launch structure comprising metallic and insulating materials arranged in a first pattern having a second impedance that is matched to the first impedance such that a voltage standing wave ratio (VSWR) of the bump launch structure is less than 4:1, wherein the first pattern of the bump launch structure comprises a metallic trace extending generally parallel to a major lateral dimension of the laminate substrate for transferring signals laterally and comprising at least two turns and a variable width portion along at least a portion of a length of the first pattern of the bump launch structure, the variable width portion of the metallic trace disposed in a same plane as the at least two turns, wherein the variable width portion is positioned between the at least two turns and a conductive via, and wherein the variable width portion is positioned adjacent to a location at which the metallic trace connects to the conductive via.

2. The integrated device package of claim 1, further comprising a ball launch structure defined at least in part by one or more layers at or near the back side of the laminate substrate, the ball launch structure comprising metallic and insulating materials arranged in a second pattern having a third impedance.

3. The integrated device package of claim 1, further comprising one or more traces or vias that electrically connect the first pattern of the bump launch structure and the second pattern of the ball launch structure.

4. The integrated device package of claim 3, further comprising a plurality of solder balls electrically and mechanically connected to the back side of the laminate substrate, wherein the ball launch structure further comprises the plurality of solder balls.

5. The integrated device package of claim 4, further comprising a system board having a fourth impedance, the laminate substrate mounted to a front side of the system board by way of the plurality of solder balls, wherein the ball launch structure further comprises one or more layers at or near the front side of the system board, wherein the third and fourth impedances are matched such that a voltage standing wave ratio (VSWR) of the ball launch structure is less than 5:1.

6. The integrated device package of claim 1, wherein at least one of the bump launch structure and the ball launch structure comprises a plurality of metallic vias spaced apart by an insulator, the plurality of metallic vias extending through one or more layers of the laminate substrate, wherein spacings between adjacent metallic vias define a corresponding capacitance that defines at least in part the second impedance or the third impedance.

7. The integrated device package of claim 1, wherein the second pattern of the ball launch structure comprises a metallic trace comprising at least two turns and a variable width along at least a portion of a length of the second pattern, the metallic trace of the ball launch structure is electrically connected with a metallic via, the metallic via extending through one or more layers of the laminate substrate.

8. The integrated device package of claim 1, wherein the bump launch structure further comprises the plurality of conductive bumps.

9. The integrated device package of claim 1, wherein the integrated device die comprises an underbump metallization (UBM) layer, the plurality of conductive bumps connected to the UBM layer, the bump launch structure further comprising the UBM layer.

10. The integrated device package of claim 1, wherein the one or more operational frequencies comprises frequencies in a range of 0.5 GHz to 60 GHz.

11. The integrated device package of claim 1, wherein the RF circuitry of the integrated device die operates over a 0.5 dB bandwidth of frequencies.

12. A laminate substrate for supporting a radio frequency (RF) integrated device die configured to operate at one or more operational frequencies, the laminate substrate having a front side and a back side opposite the front side, the laminate substrate comprising:
  a bump launch structure defined at least in part by one or more layers at or near the front side of the laminate substrate, the bump launch structure comprising metallic and insulating materials arranged in a first pattern having a first impedance at the one or more operational frequencies, the first impedance of the bump launch structure configured to substantially match an impedance of the RF integrated device die having radio frequency (RF) circuitry;

a ball launch structure defined at least in part by one or more layers at or near the back side of the laminate substrate, the ball launch structure comprising metallic and insulating materials arranged in a second pattern having a second impedance at the one or more operational frequencies, the second impedance of the ball launch structure configured to substantially match an impedance of a system board; and one or more traces or vias that electrically connect the bump launch structure and the ball launch structure, the vias extending along a direction transverse to a major lateral dimension of the laminate substrate, wherein at least one of the first pattern of the bump launch structure and the second pattern of the ball launch structure comprises a metallic trace connected to the vias and extending generally parallel to the major lateral dimension of the laminate substrate for transferring signals laterally and comprising at least two turns and a variable width portion along at least a portion of a length of at least one of the first pattern of the bump launch structure and the second pattern of the ball launch structure, the variable width portion of the metallic trace disposed in a same plane as the at least two turns, wherein the variable width portion is positioned between the at least two turns and the via, and wherein the variable width portion is positioned adjacent to a location at which the metallic trace connects to the via, and wherein the vias are spaced apart by a variable pitch.

13. The laminate substrate of claim 12, further comprising a plurality of solder balls electrically and mechanically connected to the back side of the laminate substrate.

14. The laminate substrate of claim 13, wherein the ball launch structure further comprises the plurality of solder balls.

15. The laminate substrate of claim 12, wherein the one or more operational frequencies are in a range of DC to 75 GHz.

16. The laminate substrate of claim 12, wherein at least one of the bump launch structure and the ball launch structure comprises a plurality of metallic vias spaced apart by an insulator, the plurality of metallic vias extending through one or more layers of the laminate substrate.

17. The laminate substrate of claim 12, wherein the metallic trace is electrically connected with a metallic via, the metallic via extending through one or more layers of the laminate substrate.

18. An electronic device comprising:

a system board having a first radio frequency (RF) communications line, the first RF communications line having a first impedance at one or more operational frequencies;

a laminate substrate mounted to the system board, the laminate substrate having a front side and a back side opposite the front side;

a plurality of solder balls disposed between the system board and the back side of the laminate substrate, the solder balls electrically connecting the system board and the laminate substrate; and a ball launch structure defined at least in part by one or more layers at or near the back side of the laminate substrate, the ball launch structure comprising metallic and insulating materials arranged in a first pattern having a second impedance at the one or more operational frequencies, the second impedance of the ball launch structure matched to the first impedance of the first RF communications line such that a voltage standing wave ratio (VSWR) of the ball launch structure is less than 5:1, wherein the first pattern of the ball launch structure comprises a metallic trace extending generally parallel to a major lateral dimension of the laminate substrate for transferring signals laterally and comprising at least two turns and a variable with portion along at least a portion of a length of the first pattern of the ball launch structure, the variable width portion of the metallic trace disposed in a same plane as the at least two turns, wherein the variable width portion is positioned between the at least two turns and a conductive via, and wherein the variable width portion is positioned adjacent to a location at which the metallic trace connects to the conductive via.

19. The electronic device of claim 18, further comprising an integrated device die mounted to the laminate substrate by way of one or more conductive bumps, the integrated device die comprising radio frequency (RF) circuitry and having a third impedance.

20. The electronic device of claim 19, further comprising a bump launch structure defined at least in part by one or more layers at or near the front side of the laminate substrate, the bump launch structure comprising metallic and insulating materials arranged in a second pattern having a fourth impedance that is matched to the third impedance such that a voltage standing wave ratio (VSWR) of the bump launch structure is less than 3:1.

21. The integrated device package of claim 1, wherein the metallic trace comprises a serpentine metallic trace comprising at least one crest and at least one trough as viewed from a top plan view.

22. The laminate substrate of claim 12, wherein the metallic trace comprises a serpentine metallic trace comprising at least one crest and at least one trough as viewed from a top plan view.

* * * * *

UNITED STATES PATENT AND TRADEMARK OFFICE
CERTIFICATE OF CORRECTION

| | | |
|---|---|---|
| PATENT NO. | : 11,894,322 B2 | |
| APPLICATION NO. | : 16/421221 | |
| DATED | : February 6, 2024 | |
| INVENTOR(S) | : Bruce E. Wilcox | |

It is certified that error appears in the above-identified patent and that said Letters Patent is hereby corrected as shown below:

In the Specification

In Column 2, Line 33, delete "frequencies," and insert --frequencies.--.

In Column 13, Line 48, delete "3.3." and insert --3.3--.

In Column 14, Line 62, after "1.1:1" insert --.--.

In the Claims

In Column 17, Claim 12, Line 13, delete "or" and insert --and--.

In Column 18, Claim 18, Line 24, delete "with" and insert --width--.

Signed and Sealed this
Seventh Day of May, 2024

Katherine Kelly Vidal
*Director of the United States Patent and Trademark Office*